(12) United States Patent
Shen

(10) Patent No.: US 11,737,274 B2
(45) Date of Patent: Aug. 22, 2023

(54) CURVED CHANNEL 3D MEMORY DEVICE

(71) Applicant: MACRONIX INTERNATIONAL CO., LTD., Hsinchu (TW)

(72) Inventor: Kuan-Yuan Shen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 247 days.

(21) Appl. No.: 17/170,542

(22) Filed: Feb. 8, 2021

(65) Prior Publication Data

US 2022/0254803 A1 Aug. 11, 2022

(51) Int. Cl.
*H10B 43/27* (2023.01)
*G11C 8/14* (2006.01)
*H10B 43/10* (2023.01)

(52) U.S. Cl.
CPC ............... *H10B 43/27* (2023.02); *G11C 8/14* (2013.01); *H10B 43/10* (2023.02)

(58) Field of Classification Search
CPC ......... H01L 27/11582; H01L 27/11565; G11C 8/14
See application file for complete search history.

(56) References Cited

U.S. PATENT DOCUMENTS

| | | | |
|---|---|---|---|
| 4,219,829 A | 8/1980 | Dorda et al. | |
| 4,987,090 A | 1/1991 | Hsu et al. | |
| 5,586,073 A | 12/1996 | Hiura et al. | |
| 5,963,803 A * | 10/1999 | Dawson | H01L 21/823864 438/231 |
| 6,034,882 A | 3/2000 | Johnson et al. | |
| 6,107,882 A | 8/2000 | Gabara et al. | |
| 6,313,486 B1 | 11/2001 | Kencke et al. | |
| 6,486,027 B1 | 11/2002 | Noble et al. | |
| 6,593,624 B2 | 7/2003 | Walker | |
| 6,829,598 B2 | 12/2004 | Milev | |

(Continued)

FOREIGN PATENT DOCUMENTS

| | | |
|---|---|---|
| TW | 201807807 A | 3/2018 |
| TW | 201939717 A | 10/2019 |

OTHER PUBLICATIONS

Chen et al., "Eyeriss: An Energy-Efficient reconfigurable accelerator for deep convolutional neural networks," IEEE ISSCC, Jan. 31-Feb. 4, 2016, 3 pages.

(Continued)

*Primary Examiner* — Thao X Le
*Assistant Examiner* — Sean Ayers Winters
(74) *Attorney, Agent, or Firm* — Andrew L. Dunlap; Haynes Beffel & Wolfeld LLP

(57) ABSTRACT

A vertical memory structure comprises a stack of alternating layers of insulator material and word line material with a vertical opening through the alternating layers. One of the layers of insulating material and layers of word line material have recessed inside surfaces facing the opening. First and second conductive pillars are disposed inside the vertical opening. A data storage structure is disposed on the inside surfaces of the layers of word line material, including on the recessed inside surfaces. A semiconductor channel layer is disposed on the data storage structures around a perimeter of the vertical opening, and having first and second source/drain terminals at contacts with the first and second conductive pillars.

20 Claims, 22 Drawing Sheets

(56) References Cited

U.S. PATENT DOCUMENTS

| | | |
|---|---|---|
| 6,906,940 B1 | 6/2005 | Lue |
| 6,960,499 B2 | 11/2005 | Nandakumar et al. |
| 7,081,377 B2 | 7/2006 | Cleeves |
| 7,129,538 B2 | 10/2006 | Lee et al. |
| 7,177,169 B2 | 2/2007 | Scheuerlein |
| 7,368,358 B2 | 5/2008 | Ouyang et al. |
| 7,646,041 B2 | 1/2010 | Chae et al. |
| 7,747,668 B2 | 6/2010 | Nomura et al. |
| 7,948,024 B2 | 5/2011 | Kim et al. |
| 8,154,128 B2 | 4/2012 | Lung |
| 8,203,187 B2 | 6/2012 | Lung et al. |
| 8,275,728 B2 | 9/2012 | Pino |
| 8,331,149 B2 | 12/2012 | Choi et al. |
| 8,432,719 B2 | 4/2013 | Lue |
| 8,564,045 B2 | 10/2013 | Liu |
| 8,589,320 B2 | 11/2013 | Breitwisch et al. |
| 8,630,114 B2 | 1/2014 | Lue |
| 8,860,124 B2 | 10/2014 | Lue et al. |
| 9,064,903 B2 | 6/2015 | Mitchell et al. |
| 9,111,617 B2 | 8/2015 | Shim et al. |
| 9,147,468 B1 | 9/2015 | Lue |
| 9,177,966 B1 | 11/2015 | Rabkin et al. |
| 9,379,129 B1 | 6/2016 | Lue et al. |
| 9,401,371 B1 | 7/2016 | Lee et al. |
| 9,430,735 B1 | 8/2016 | Vali et al. |
| 9,431,099 B2 | 8/2016 | Lee et al. |
| 9,520,485 B2 | 12/2016 | Lue |
| 9,524,980 B2 | 12/2016 | Lue |
| 9,536,969 B2 | 1/2017 | Yang et al. |
| 9,589,982 B1 | 3/2017 | Cheng et al. |
| 9,698,156 B2 | 7/2017 | Lue |
| 9,698,185 B2 | 7/2017 | Chen et al. |
| 9,710,747 B2 | 7/2017 | Kang et al. |
| 9,754,953 B2 | 9/2017 | Tang et al. |
| 10,043,819 B1 | 8/2018 | Lai et al. |
| 10,211,218 B2 | 2/2019 | Lue |
| 10,242,737 B1 | 3/2019 | Lin et al. |
| 10,381,376 B1* | 8/2019 | Nishikawa ............ H10B 43/27 |
| 10,403,637 B2 | 9/2019 | Lue |
| 10,777,566 B2 | 9/2020 | Lue |
| 10,790,023 B2 | 9/2020 | Harari |
| 10,910,393 B2 | 2/2021 | Lai et al. |
| 2001/0055838 A1 | 12/2001 | Walker et al. |
| 2002/0028541 A1 | 3/2002 | Lee et al. |
| 2003/0122181 A1 | 7/2003 | Wu |
| 2005/0280061 A1 | 12/2005 | Lee |
| 2005/0287793 A1 | 12/2005 | Blanchet et al. |
| 2007/0158736 A1 | 7/2007 | Arai et al. |
| 2008/0101109 A1 | 5/2008 | Haring-Bolivar et al. |
| 2009/0097321 A1 | 4/2009 | Kim et al. |
| 2009/0184360 A1 | 7/2009 | Jin et al. |
| 2010/0182828 A1 | 7/2010 | Shima et al. |
| 2010/0202208 A1 | 8/2010 | Endo et al. |
| 2010/0270593 A1 | 10/2010 | Lung et al. |
| 2011/0018051 A1 | 1/2011 | Kim et al. |
| 2011/0063915 A1 | 3/2011 | Tanaka et al. |
| 2011/0106742 A1 | 5/2011 | Pino |
| 2011/0140070 A1 | 6/2011 | Kim |
| 2011/0286258 A1 | 11/2011 | Chen et al. |
| 2011/0297912 A1 | 12/2011 | Samachisa et al. |
| 2012/0044742 A1 | 2/2012 | Narayanan |
| 2012/0112264 A1 | 5/2012 | Lee et al. |
| 2012/0235111 A1 | 9/2012 | Osano et al. |
| 2013/0075684 A1 | 3/2013 | Kinoshita et al. |
| 2013/0119455 A1 | 5/2013 | Chen et al. |
| 2014/0063949 A1 | 3/2014 | Tokiwa |
| 2014/0119127 A1 | 5/2014 | Lung et al. |
| 2014/0149773 A1 | 5/2014 | Huang et al. |
| 2014/0268996 A1 | 9/2014 | Park |
| 2015/0008500 A1 | 1/2015 | Fukumoto et al. |
| 2015/0179661 A1 | 6/2015 | Huo et al. |
| 2015/0340369 A1 | 11/2015 | Lue |
| 2016/0043100 A1 | 2/2016 | Lee et al. |
| 2016/0141299 A1 | 5/2016 | Hong |
| 2016/0141337 A1 | 5/2016 | Shimabukuro et al. |
| 2016/0181315 A1 | 6/2016 | Lee et al. |
| 2016/0247579 A1 | 8/2016 | Ueda et al. |
| 2016/0308114 A1 | 10/2016 | Kim et al. |
| 2016/0329341 A1 | 11/2016 | Shimabukuro et al. |
| 2016/0336064 A1 | 11/2016 | Seo et al. |
| 2016/0358661 A1 | 12/2016 | Vali et al. |
| 2017/0084748 A1 | 3/2017 | Yang |
| 2017/0092370 A1 | 3/2017 | Harari |
| 2017/0148517 A1 | 5/2017 | Harari |
| 2017/0169887 A1 | 6/2017 | Widjaja |
| 2017/0243879 A1 | 8/2017 | Yu et al. |
| 2017/0270405 A1 | 9/2017 | Kurokawa |
| 2017/0287928 A1 | 10/2017 | Kanamori et al. |
| 2017/0309634 A1 | 10/2017 | Noguchi et al. |
| 2017/0316833 A1 | 11/2017 | Ihm et al. |
| 2017/0317096 A1 | 11/2017 | Shin et al. |
| 2018/0121790 A1 | 5/2018 | Kim et al. |
| 2018/0182776 A1 | 6/2018 | Kim |
| 2018/0350823 A1 | 12/2018 | Or-Bach et al. |
| 2019/0148393 A1 | 5/2019 | Lue |
| 2019/0220249 A1 | 7/2019 | Lee et al. |
| 2019/0244662 A1 | 8/2019 | Lee et al. |
| 2019/0286419 A1 | 9/2019 | Lin et al. |
| 2020/0026993 A1 | 1/2020 | Otsuka |
| 2020/0098784 A1 | 3/2020 | Nagashima et al. |
| 2020/0098787 A1* | 3/2020 | Kaneko ............ H10B 41/27 |
| 2020/0227432 A1 | 7/2020 | Lai et al. |
| 2020/0343252 A1 | 10/2020 | Lai et al. |
| 2020/0365611 A1 | 11/2020 | Hung et al. |
| 2020/0381450 A1 | 12/2020 | Lue et al. |
| 2020/0402997 A1* | 12/2020 | Ahn ............ H01L 29/40117 |

OTHER PUBLICATIONS

Choi et al., "Performance Breakthrough in NOR Flash Memory with Dopant-Segregated Schottky-Barrier (DSSB) SONOS Device", 2009 Symposium onVLSI Technology Digest of Technical Papers, Jun. 16-18, 2009, pp. 1-2.

Gonugondla et al., "Energy-Efficient Deep In-memory Architecture for NAND Flash Memories," IEEE International Symposium on Circuits and Systems (ISCAS), May 27-30, 2018, 5 pages.

Hsu et al., "Study of Sub-30nm Thin Film Transistor (TFT) Charge-Trapping (CT) Devices for 3D NAND Flash Application", IEDM 2009 IEEE International, Dec. 7-9, 2009, p. 1-4.

Hubert et al., "A Stacked SONOS Technology, Up to 4 Levels and 6nm Crystalline Nanowires, With Gate-All-Around on Independent Gates (Flash), Suitable for Full 3D Integration," IEEE 2009, Dec. 7-9, 2009, pp. 27.6.1-27.6.4.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.

Jung et al, "Three Dimensionally Stacked NAND Flash Memory Technology Using Stacking Single Crystal Si Layers on ILD and TANOS Structure for Beyond 30nm Node," International Electron Devices Meeting, 2006. IEDM '06, Dec. 11-13, 2006, pp. 1-4.

Katsumata et al., "Pipe-shaped BiCS flash memory with 16 stacked layers and multi-level-cell operation for ultra high density storage devices," 2009 Symp. on VLSI Technology, Jun. 16-18, 2009, 2 pages.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technolgy Digest of Technical Papers, pp. 186-187.

Kim et al., "Multi-Layered Vertical Gate NAND Flash Overcoming Stacking Limit for Terabit Density Storage,"2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE

(56) References Cited

OTHER PUBLICATIONS (Planarized Integration on the same PlanE)," IEEE 2008 Symposium on VLSI Technology Digest of Technical Papers, Jun. 17-19, 2008, pp. 122-123.

Lai et al. "Highly Reliable MA BE-SONOS (Metal-Al2O3 Bandgap Engineered SONOS) Using a SiO2 Buffer Layer," VLSI Technology, Systems and Applications 2008, VLSI-TSA International Symposium on Apr. 21-23, 2008, pp. 58-59.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lue et al., "A Novel 3D AND-type NVM Architecture Capable of High-density, Low-power In-Memory Sum-of-Product Computation for Artificial Intelligence Application," IEEE VLSI, Jun. 18-22, 2018, 2 pages.

Lue et al., "A Novel Buried-Channel FinFET BE-SONOS NAND Flash with Improved Memory Window and Cycling Endurance", 2009 Symposium on VLSI Technology Digest of Technical Papers, p. 224-225.

Meena, et al., "Overview of emerging nonvolatile memory technologies," Nanoscale Reearch Letters 9:526, Oct. 2, 2014, 34 pages.

Ohzone et al., "Ion-Implanted Thin Polycrystalline-Silicon High-Value Resistors for High-Density Poly-Load Static RAM Applications," IEEE Trans. on Electron Devices, vol. ED-32, No. 9, Sep. 1985, 8 pages.

Paul et al., "Impact of a Process Variation on Nanowire and Nanotube Device Performance", IEEE Transactions on Electron Devices, vol. 54, No. 9, Sep. 2007, p. 2369-2376.

Sakai et al., "A Buried Giga-Ohm Resistor (BGR) Load Static RAM Cell," IEEE Symp. on VLSI Technology, Digest of Papers, Sep. 10-12, 1984, 2 pages.

Schuller et al., "Neuromorphic Computing: From Materials to Systems Architecture," US Dept. of Energy, Oct. 29-30, 2015, Gaithersburg, MD, 40 pages.

Seo et al., "A Novel 3-D Vertical FG NAND Flash Memory Cell Arrays Using the Separated Sidewall Control Gate (S-SCG) for Highly Reliable MLC Operation," 2011 3rd IEEE International Memory Workshop (IMW), May 22-25, 2011, 4 pages.

Soudry, et al. "Hebbian learning rules with memristors," Center for Communication and Information Technologies CCIT Report #840, Sep. 1, 2013, 16 pages.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Wang et al., "Three-Dimensional NAND Flash for Vector-Matrix Multiplication," IEEE Trans. on Very Large Scale Integration Systems (VLSI), vol. 27, No. 4, Apr. 2019, 4 pages.

Whang, SungJin et al. "Novel 3-dimensional Dual Control-gate with Surrounding Floating-gate (DC-SF) NAND flash cell for 1Tb file storage application," 2010 IEEE Int'l Electron Devices Meeting (IEDM), Dec. 6-8, 2010, 4 pages.

* cited by examiner

CURVED CHANNEL 3D MEMORY DEVICE

BACKGROUND

Field

The present invention relates to high density memory devices, and particularly to memory devices in which multiple planes of memory cells are arranged to provide a three-dimensional 3D array.

Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin-film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

A planar NOR flash memory is a random access memory for high speed applications, but is limited in density. A three-dimensionally stacked NAND flash memory has higher density than a planar NOR flash memory but is not a random access memory and has relatively lower operating speed.

It is desirable to provide technology for a three-dimensionally stacked integrated circuit memory having higher density, random access, and higher operating speed.

SUMMARY

A vertical memory structure is described which can be used to implement high density 3D NOR memory array having memory cells with curved channel structures, which can be a convex channel structure or a concave channel structure, disposed in columns through alternating layers of insulating material and word line material.

A vertical memory structure as described herein can comprise a stack of alternating layers of insulating material and word line material, with a vertical opening therethrough. One of the layers of insulating material and layers of word line material has a recessed inside surface facing the opening, recessed relative to the inside surfaces facing the opening of adjacent ones of the alternating layers in the stack. A first conductive pillar is disposed inside and on a first side of the vertical opening. A second conductive pillar is disposed inside and on a second side of the vertical opening, separated from the first conductive pillar. The data storage structure including, for example, a dielectric charge trapping data storage structure, is disposed on the inside surfaces of the layers of word line material, including on the recessed inside surfaces. A semiconductor channel layer is disposed on the data storage structures around the perimeter of the vertical opening. The semiconductor channel layer has first and second source/drain terminals at contacts with the first and second conductive pillars in the vertical opening, on the first and second sides of the vertical opening.

For embodiments in which the layers of insulating material are recessed, convex channel structures are formed, which curve around the word line layers with radii in a plane parallel to the vertical direction. For embodiments in which the layers of word line material are recessed, concave channel structures are formed, which curve between the layers of insulating material with radii in a plane parallel to the vertical direction.

Embodiments are described in which the perimeter of the vertical opening has an opening average radius (in a plane orthogonal to the vertical direction of the opening) at the inside surface of a given layer of the layers of word line material in the stack, and the first and second conductive pillars have average radii (in a plane orthogonal to the vertical direction of the opening) that are less than one half of the opening average radius at said given layer. Also, embodiments are described in which the first and second conductive pillars have average radii (in a plane orthogonal to the vertical direction of the opening) that are more than one quarter the opening average radius, and less than one half the opening average radius.

A column of memory cells is thereby formed along the vertical conductors, and can be arranged in a NOR configuration, each cell in the column disposed at the cross-point of a layer of word line material and the vertical conductors to which thin-film layer of channel material lining the walls of the vertical opening makes contact.

A method of manufacturing a vertical memory structure is described. It can, for example, include forming a stack of alternating layers of insulator material and word line material with a vertical opening through the alternating layers. A step of recessing one of the layers of insulating material and the layers of word line material to form recessed inside surfaces facing the opening is included, where the recessed inside surfaces are recessed relative to the inside surfaces of adjacent ones of the alternating layers in the stack. A step of forming a data storage structure including, for example, a dielectric charge trapping layer lining the inside surfaces of the layers of word line material is described. Also a step of forming a semiconductor channel layer on the data storage structure around the perimeter of the vertical opening is included. The process includes forming a first conductive pillar and a second conductive pillar inside the vertical opening contacting the semiconductor channel layer to form first and second source/drain terminals on the first and second sides of the vertical opening.

Embodiments are described in which forming the stack includes first forming a stack of alternating layers of insulating material and sacrificial material, and replacing at least portions of the layers of sacrificial material with the word line material. In embodiments like this, the step of recessing can comprise recessing one of the layers of insulating material and the layers of sacrificial material, before forming data storage structures, and thereafter replacing at least portions of the layers of sacrificial material with word line material.

Other aspects and advantages of the present invention can be seen on review of the drawings, the detailed description and the claims, which follow.

DETAILED DESCRIPTION

A detailed description of embodiments of the present invention is provided with reference to the FIGS. 1A-1D through FIG. 21.

Figures 1A, 1B:
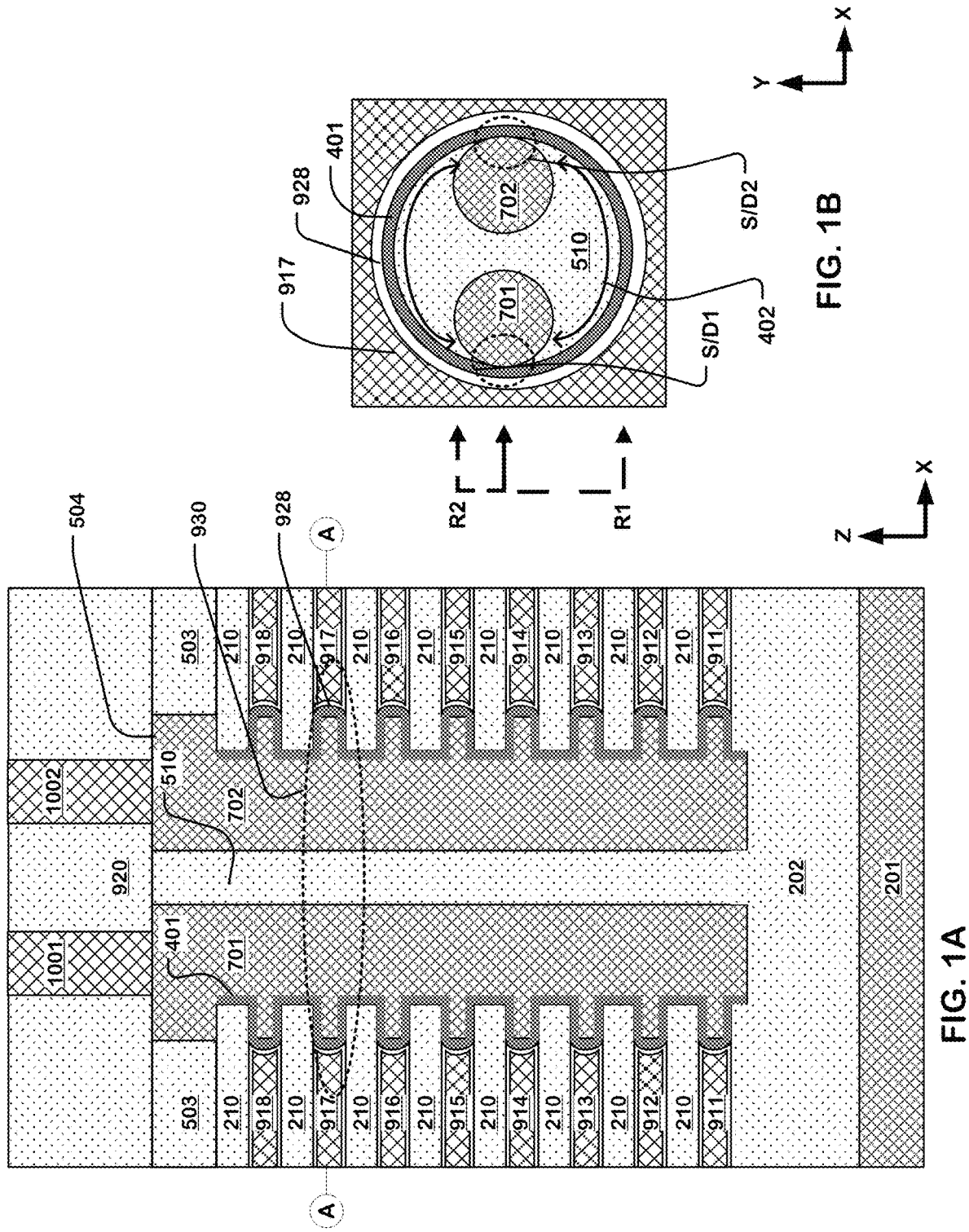
FIG. 1A is a cross-section in an X-Z plane of a concave channel, vertical memory structure as described herein.
FIG. 1B is a cross-section at line A-A of FIG. 1A, in an X-Y plane of the concave channel, vertical memory structure.

FIG. 1A illustrates a vertical memory structure that comprises a plurality of memory cells. The vertical memory structure comprises a stack of alternating layers of insulating material 210, and layers of word line material, such as tungsten or other conductive material, where the individual layers of word line material constitute word lines 911-918 in this example.

The stack is formed on a substrate, including, in this example, a layer of insulating material 202 on a semiconductor chip 201.

The stack of alternating layers includes a vertical opening passing through the stack, having structures disposed therein as discussed below. Inside surfaces of the layers of insulating material 210 and inside surfaces of the layers of word line material face the outside surfaces of the vertical opening. As mentioned above, one of the layers of insulating material 210 and word line material has recessed inside surfaces.

In the embodiment of FIG. 1A, the layers of word line material have recessed inside surfaces, recessed relative to inside surfaces facing the opening of the adjacent ones of the alternating layers of insulating material 210 in the stack. Thus, the layer of word line material constituting word line 917 has a recessed inside surface relative to the inside surfaces of the layers of insulating material 210 adjacent to it immediately above and below. The recessed inside surfaces can be curved outwardly relative to the vertical opening, between the adjacent layers of insulating material. This recess can be continuous around the perimeter of the vertical opening, forming a horizontal trench.

The vertical memory structure includes a first vertical conductive pillar 701 inside and on a first side of the vertical opening. Also, the vertical memory structure includes a second vertical conductive pillar 702 inside and on a second side of the vertical opening. The first and second conductive pillars are separated from the first conductive pillar 701 by insulating material 510 in this cross-section. The vertical conductive pillars 701 and 702 extend above the stack through insulating material layer 503, to a planarized surface 504 in this example.

A data storage structure (e.g. 928) is disposed on the inside surface of each of the layers of word line material, including on the recessed inside surfaces. The data storage structure (e.g. 928) can comprise a dielectric charge trapping film, such as implemented using so-called SONOS, BE-SONOS and related technologies, that includes a multilayer dielectric having a tunneling layer such as a silicon oxide, or a silicon oxide/silicon nitride combination (e.g. (Oxide/Nitride/Oxide), a charge trapping layer such as silicon nitride or other materials, and a blocking layer such as a silicon oxide, aluminum oxide and combinations of such materials.

In the illustrated example, the data storage structures (e.g. 928) line the upper and lower sides of the layers of word line material, and the inside surface of the layer of word line material.

A semiconductor channel layer 401 is disposed on the data storage structures around the perimeter of the vertical opening between the data storage structures and the first and second vertical conductive pillars 701, 702, at least at the levels of the word lines. The semiconductor thin-film channel layer has first and second source/drain terminals at contacts with the first and second conductive pillars on the first and second sides of the vertical opening.

The channel layer is a thin-film semiconductor layer such as polysilicon, germanium and silicon/germanium, used for charge transport during operation of the memory cells.

The first and second conductive pillars 701, 702 in the vertical opening fill the regions formed by the recessed inside surfaces of the layers of word line material and the thin-film channel layer 401, between the layers of insulating material 210. Thin-film channel layer 401 therefore forms a concave channel region at each of the word lines 911-918, which extends around the perimeter of the vertical opening. At each layer, such as the layer at word line 917, a memory cell 930 is formed. This concave channel region over the recessed inside surfaces of the layers of word line material can be continuous around the perimeter of the vertical opening, forming a horizontal channel. The memory cells formed thereby have a curved and confined channel layer, between the adjacent layers of insulating material. This structure can result in better isolation between the layers of memory cells, and less disturbance of neighboring cells when activating a given cell in the stack.

A layer of insulating material 920 is disposed over the stack. Contact plugs 1001 and 1002 can be formed through the insulating material 920 for connection to the vertical conductive pillars 701 and 702 at the planarized surface 504.

A plurality of bit line select transistors (not shown) can be disposed over and connected to respective contact plugs 1001, 1002. A plurality of bit lines (not shown) can be disposed over and connected to bit line select transistors in the plurality of bit line select transistors, the bit lines extending in a second direction (Y-direction) orthogonal to the first direction (X-direction). A plurality of gate lines can be disposed at the level of the bit line select transistors and connected to bit line select transistors in the plurality of bit line select transistors. The bit line select transistors can comprise channel films connected at lower ends to respective vertical conductive structures. The bit lines can be connected to the bit line select transistors via contacts to respective upper ends of the channel films.

FIG. 1B is a cross-section taken at line A-A of FIG. 1A through the memory cell 930.

The vertical opening as illustrated is circular in this example. In other embodiments, the vertical opening can be elliptical or have other shapes.

Inside the vertical opening, a first conductive pillar 701 and a second conductive pillar 702 are disposed, through insulating material 510.

As seen in FIG. 1B, the layer of word line material constituting word line 917 has a data storage structure 928 disposed on its inside surface. A thin film channel layer 401, such as polysilicon, is disposed on the data storage structure 928, extending around the perimeter of the vertical opening. The thin-film channel layer 401 has a contact S/D1 with the first conductive pillar 701 on a first side of the vertical opening, and a contact S/D2 with the second conductive pillar 702 on a second side of vertical opening. Source/drain terminals are formed at the contacts S/D1 and S/D2.

The memory cell (930) formed at this layer has channel regions which extend around the perimeter of the vertical opening as indicated at the arrows (e.g. 402) indicating the current flow direction between the source/drain terminals at the contacts S/D1 and S/D2. A column of memory cells is disposed on the vertical conductors in a NOR configuration, each cell in the column disposed at the cross-point of a layer of word line material and the thin-film layer of channel material lining the walls of the vertical opening.

The memory cell can be a dielectric charge trapping memory cell, in which charge is trapped in the data storage structure 928, representing data, over the channel region between the source and drain terminals. The gate of the memory cell is formed by the word line 917.

The vertical opening has an outside perimeter with an opening average radius R1 as illustrated in this example (not including the thickness of the data storage structure 928 and the thin film channel layer 401), at the inside surface of the layer of word line material constituting the word line 917. The first and second conductive pillars have average radii R2, which can be, but are not necessarily, the same. In advantageous embodiments, the average radii R2 are more than one quarter of the opening average radius R1, and less than one half of the opening average radius R2. As a result, the vertical conductive pillars 701 and 702 can be electrically isolated, and relatively conductive as a result of substantial cross-sectional area, and have a substantial area of electrical contact with the thin-film channel layer 401.

Figure 1C:
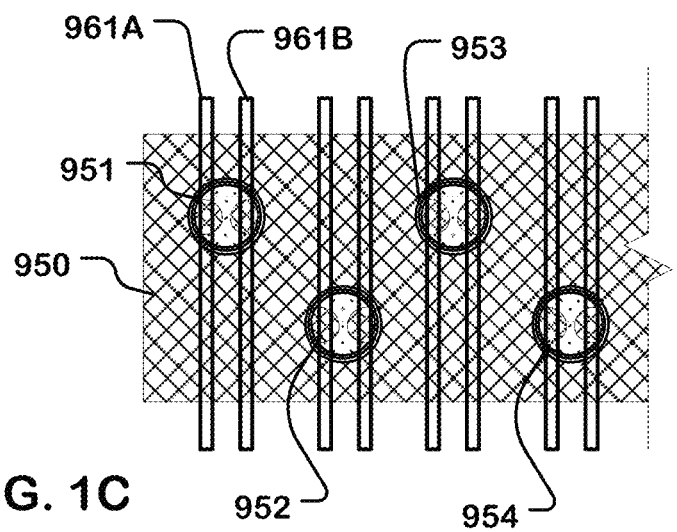
FIG. 1C is a layout view of a plurality of vertical memory structures forming an array of memory cells.

FIG. 1C is a layout view of an array including a plurality of vertical memory structures like that of FIG. 1A disposed through a single stack of word lines. Thus, a word line 950 at a given layer of the stack is illustrated. Vertical memory structures 951, 952, 953, 954 are disposed in offset rows for improved density through the stack of word lines including word line 950. In other embodiments, the vertical memory structures can be arranged in a straight line, or in other arrangements suitable for particular implementations.

Overlying bit lines (e.g. 961A, 961B) are formed in electrical contact with, or operatively coupled by select transistors to, the vertical conductive pillars in each of the vertical memory structures. Thus, a large array of vertical memory structures can be implemented on an integrated circuit.

Figure 1D:
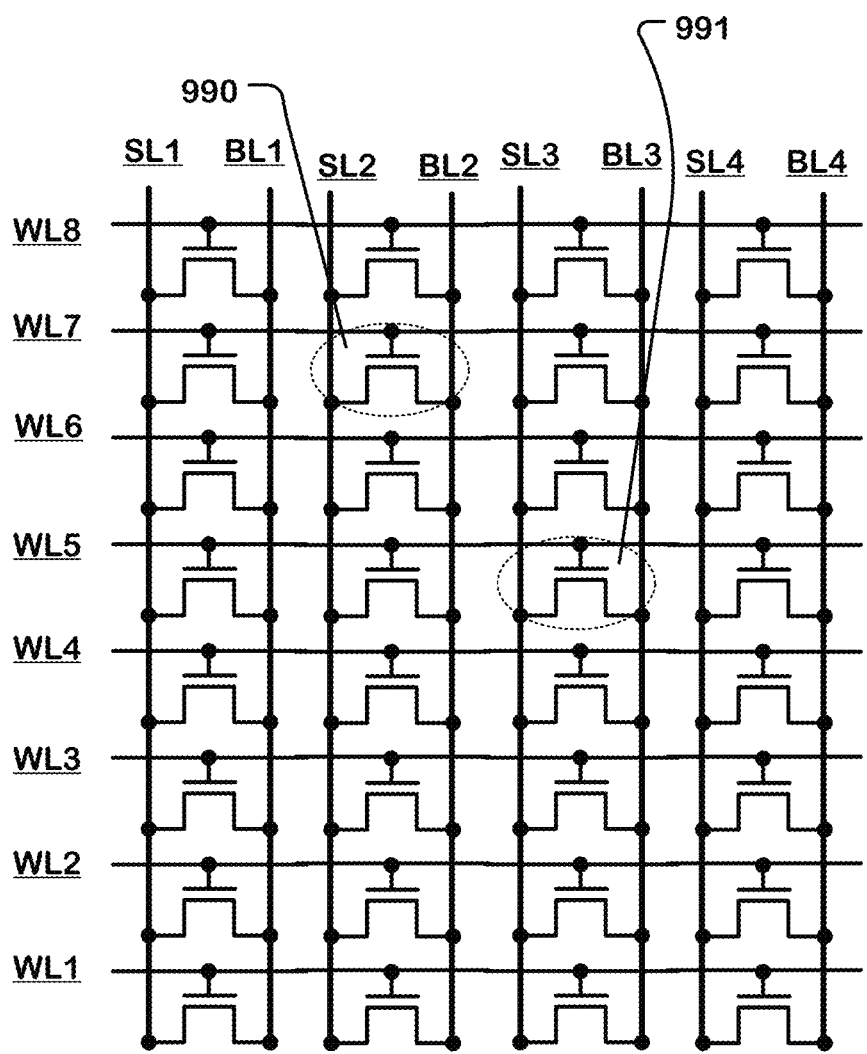
FIG. 1D is a circuit diagram of an array of memory cells such as represented by FIGS. 1A-1C.

FIG. 1D is a schematic circuit diagram of a NOR array of memory cells implemented as illustrated in FIG. 1C.

Thus, the vertical conductive pillars include SL1 and BL1, SL2 and BL2, SL3 and BL3, and SL4 and BL4. At each layer, an individual word line WL1 to WL8 is disposed, and penetrated by the plurality of conductive pillars. Memory cells (e.g. 990, 991) are disposed at the cross-points of the word lines and the vertical conductive pillars.

FIGS. 2-9 illustrate stages in a manufacturing process for a concave channel vertical memory structure like that of FIGS. 1A and 1B.

Figure 2:
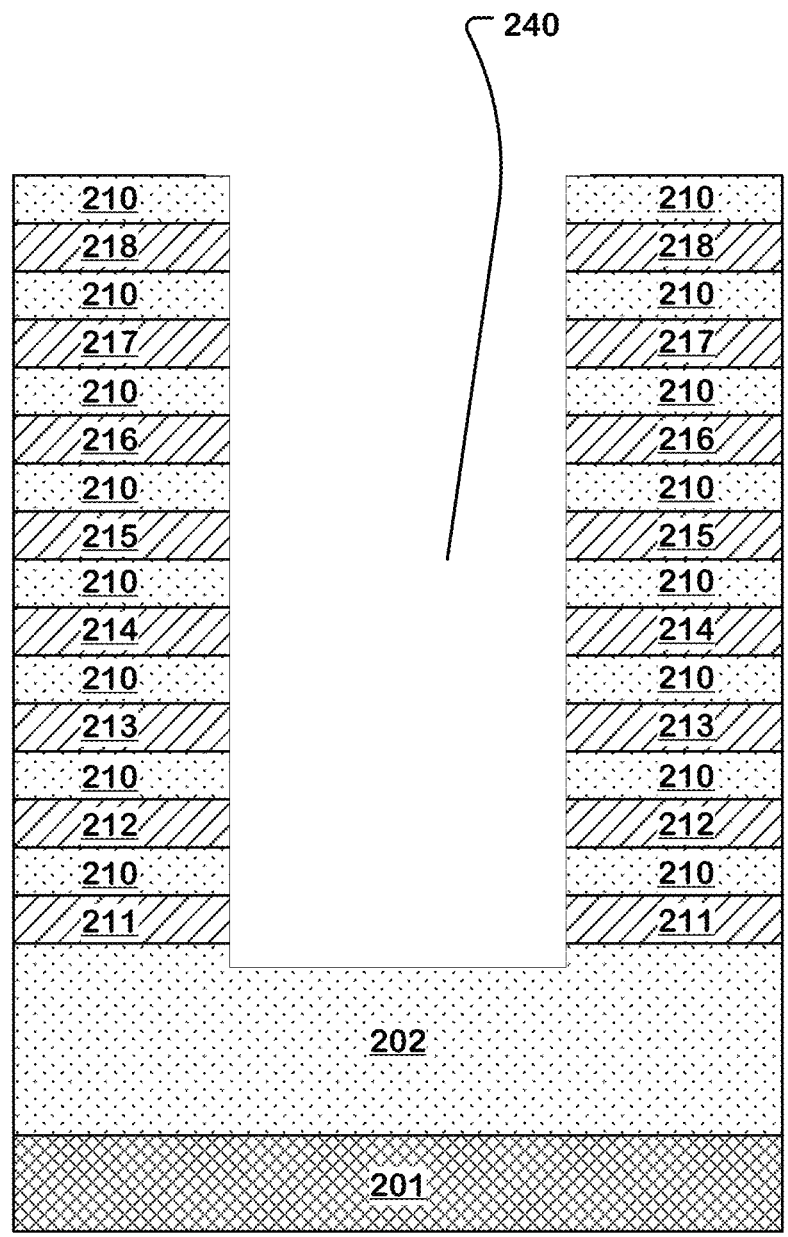
FIGS. 2-9 illustrate stages in a manufacturing process usable to manufacture the concave channel, vertical memory structure of FIGS. 1A-1C.

FIG. 2 illustrates a subassembly after providing a substrate that includes a semiconductor chip 201 and a layer of insulating material 202, forming a stack on the substrate of alternating layers of an insulating material 210 such as silicon oxide, and a sacrificial material such as silicon nitride, where the sacrificial material is disposed in the stack at the locations 211-218 of word lines, and etching a vertical opening 240 through the stack extending below the location 211 of the lowest layer of sacrificial material, and to the surface of the layer of insulating material 202 in this example.

Figure 3:
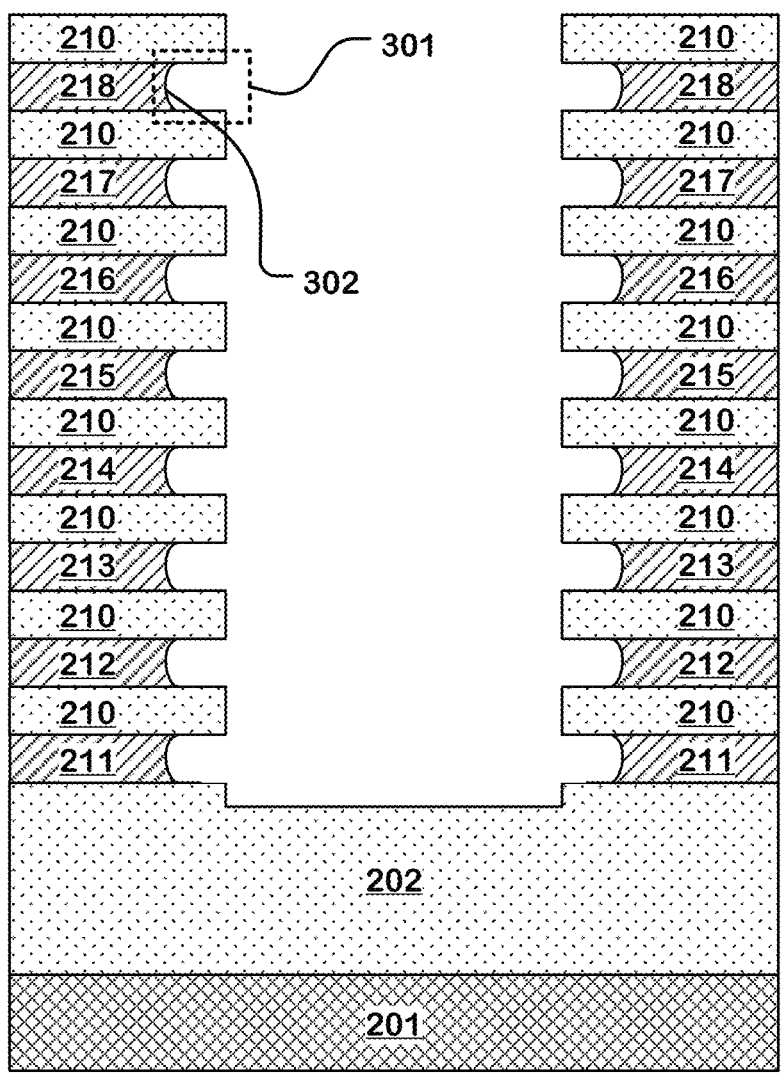

FIG. 3 illustrates a subassembly after utilizing a dry or wet etching technique having high selectivity for the sacrificial material relative to the insulating material 210 to pull back the inside surfaces of the sacrificial material. For example, a wet etching technique can use a solution of $H_3PO_4$ when the insulating material is silicon oxide, and the sacrificial material is silicon nitride. As result of the pullback etching, layers of sacrificial material (e.g. 218) have inside surfaces facing the outside surfaces of the vertical opening that are curved between the adjacent layers of insulating material 210. This forms recesses (e.g. 301) defined by the outside edges of the layers of insulating material 210, and the recessed inside surfaces (e.g. 302) of the layers of sacrificial material.

Figure 4:
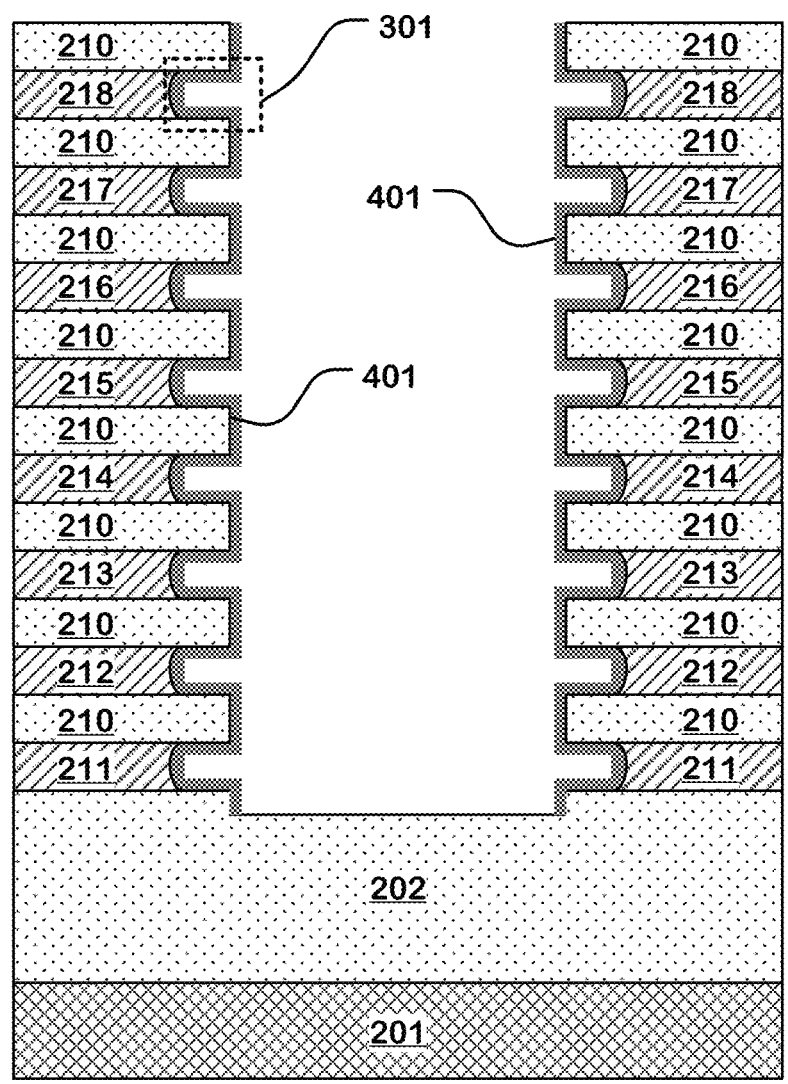

FIG. 4 illustrates a subassembly after depositing a thin-film channel layer 401 of channel material over the structure, and then anisotropic etching to remove the material from the bottom and top of the vertical opening. The thin-film channel layer 401 lines the inside surfaces of the vertical opening around the full perimeter of the opening. The thin-film channel layer 401 is disposed on the recessed inside surfaces of the layers of sacrificial material, and on the protruding inside surfaces of the layers of insulating material 210. As seen in the recess 301, the thin-film channel layer 401 covers and curves around (on radii in a plane parallel to the vertical direction of the vertical opening) the recessed inside surface of the layers of sacrificial material, and the exposed underside of the adjacent layer of insulating material 210 on the top of the recess, and the exposed upper side of the adjacent layer of insulating material 210 on the bottom of the recess. Also, in this embodiment, thin-film channel layer 401 covers the protruding inside surfaces of the layers of insulating material 210 so that it is continuous from the top layer of sacrificial material to the bottom layer of sacrificial material of the vertical opening. In other embodiments, the thin-film channel layer 401 can be removed from the exposed inside surfaces of the layers of insulating material 210.

Figure 5:
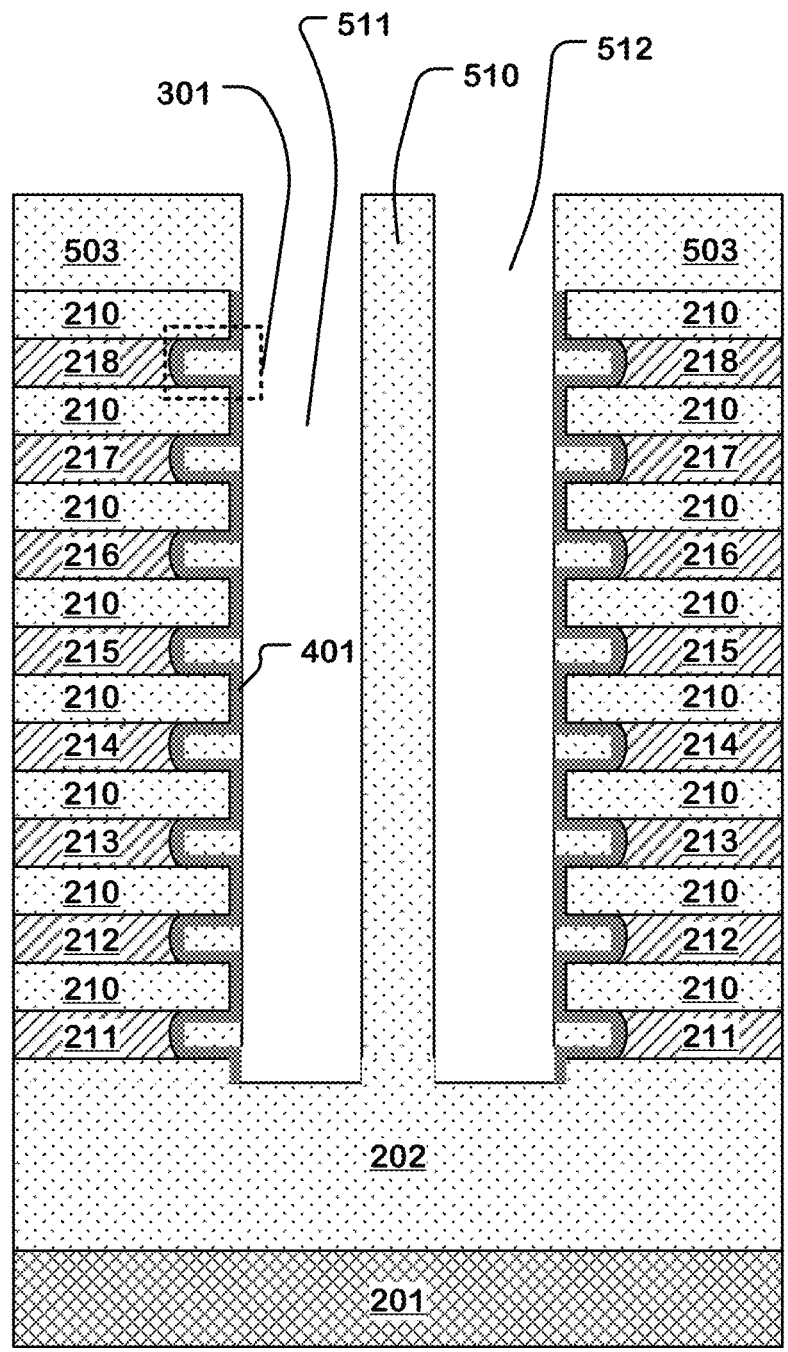

FIG. 5 illustrates a subassembly after filling the vertical opening with an insulating material 510, including insulating material layer 503 over the stack, planarizing a structure such as by using chemical mechanical polishing, and then forming openings 511, 512 therethrough in which vertical conductors can be formed. At this stage, the recess 301 may also be filled with insulating material 510. The openings 511 and 512 for the vertical conductors extend below the lowest layer of sacrificial material to be used as a word line 211 in this embodiment, and to the underlying layer of insulating material 202.

Figure 6:
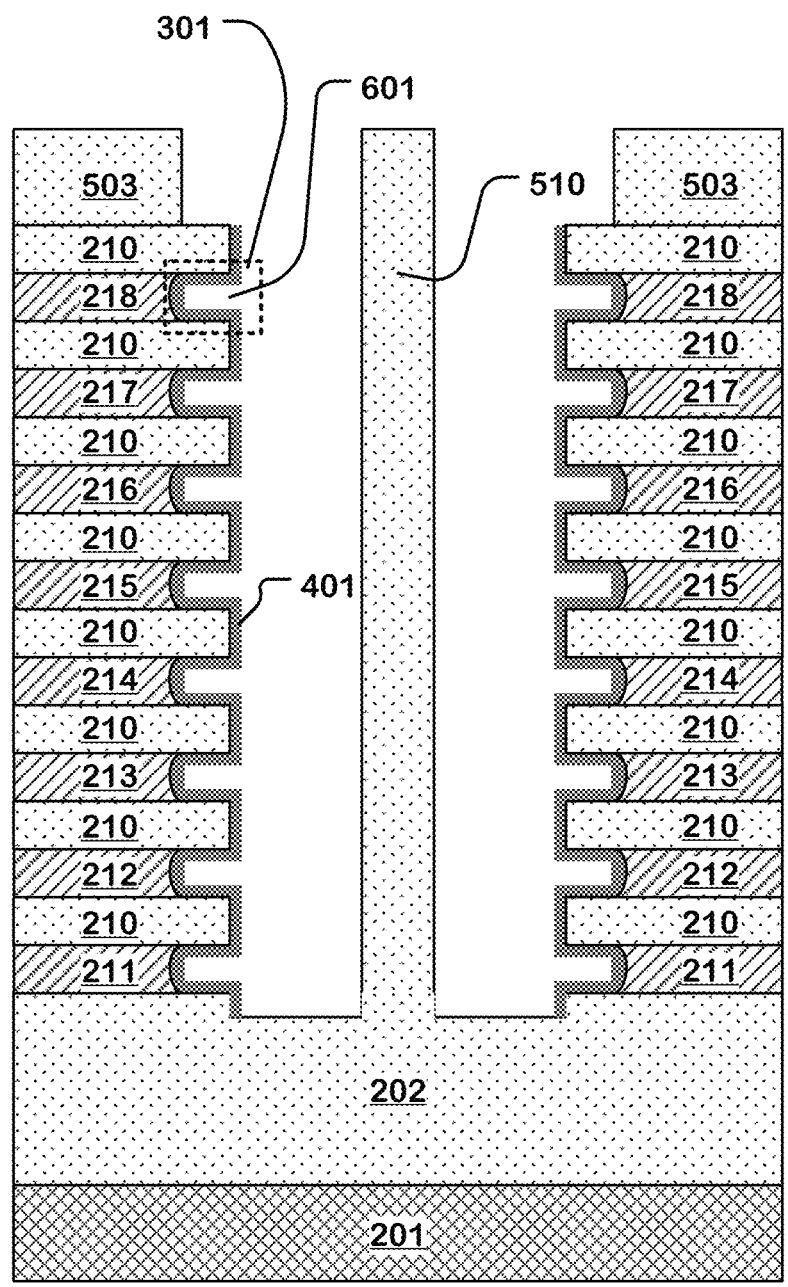

FIG. 6 illustrates a subassembly after a pullback etch to remove the insulating material 510 from within the recesses forming voids (e.g. 601). Thus, the voids 601 within recess 301 after the pullback of the insulating material 510 remains lined by the thin-film channel layer 401, but is otherwise empty.

Figure 7:
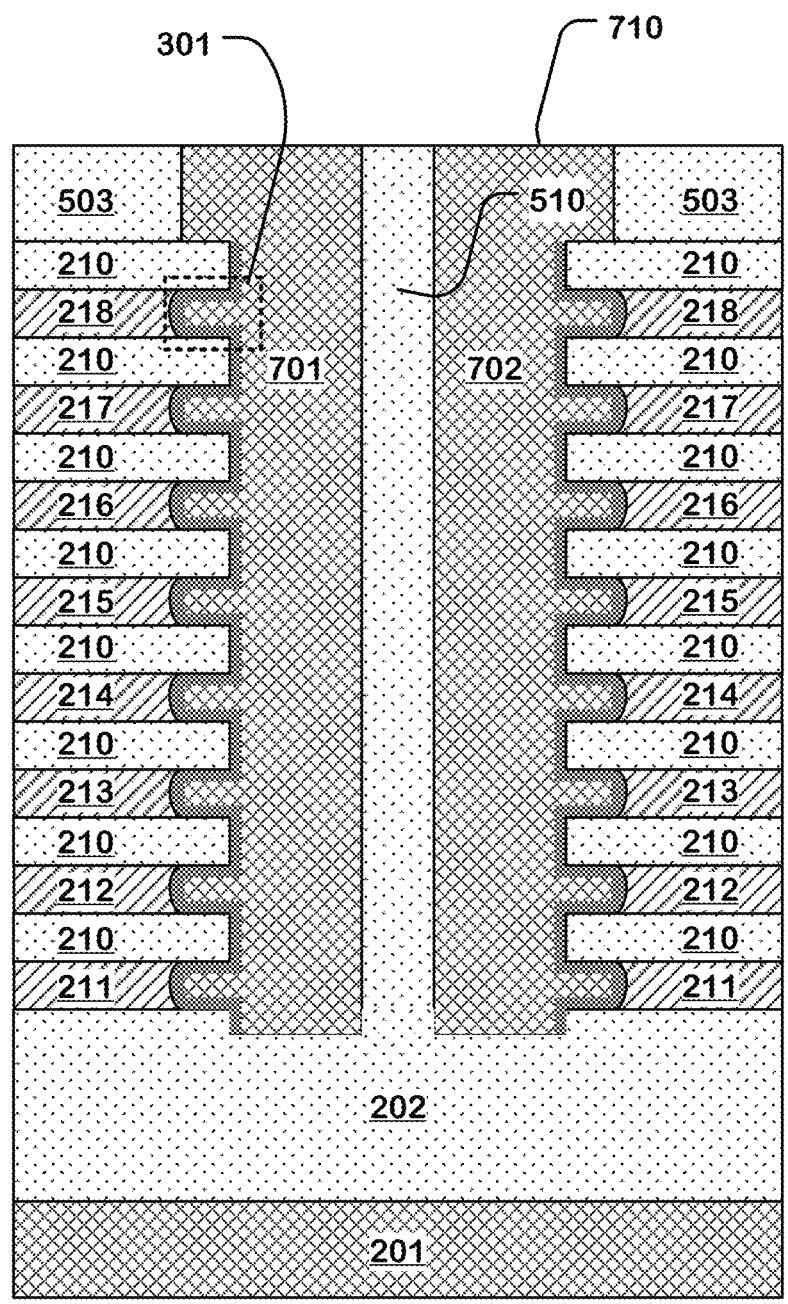

FIG. 7 illustrates a subassembly after performing a vertical conductor fill in, such as a polysilicon plug fill into the openings 511 and 512, including filling the recesses (e.g. 301). An etch back or planarizing step, such as chemical mechanical polishing, is then applied to form a planar surface 710. The vertical conductors filling in the openings 511 and 512 make electrical contact with the thin-film channel layer 401.

Figure 8:
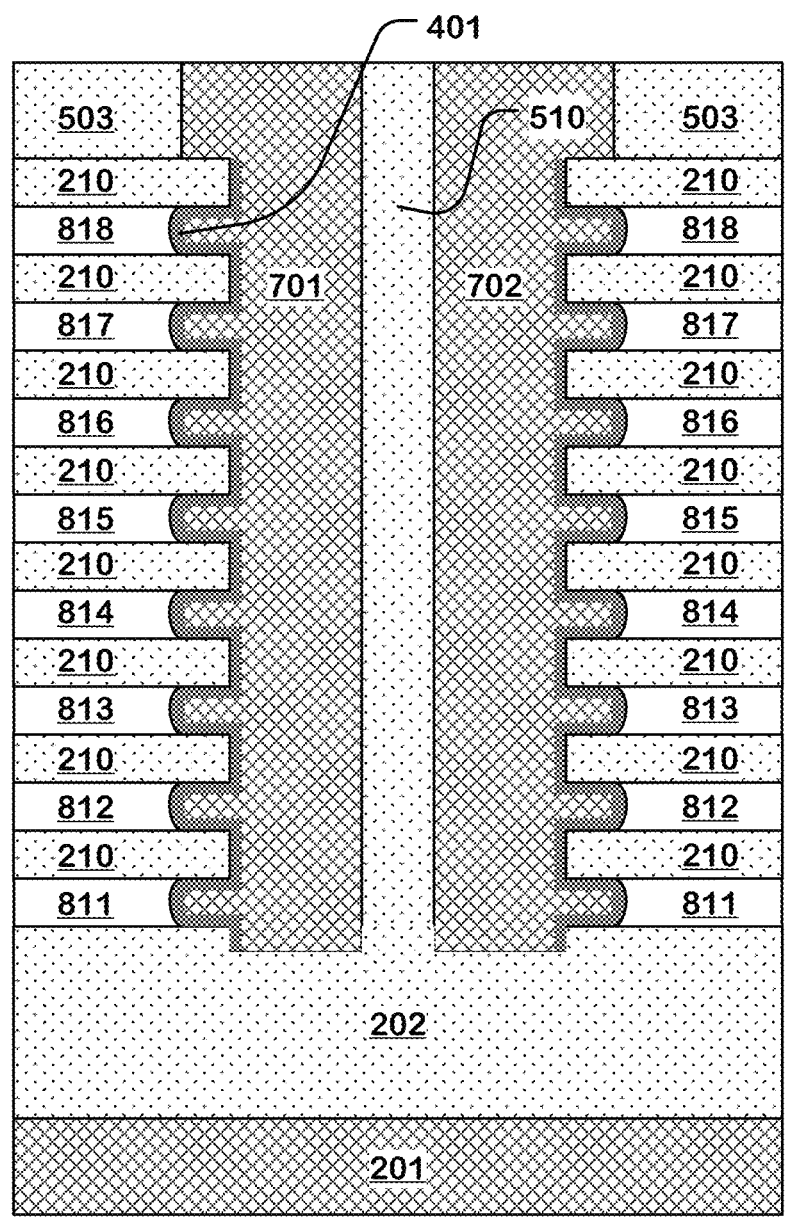

FIG. 8 illustrates a subassembly after removing the layers of sacrificial material 211-218. This can be done through a lateral opening, not shown, applying an etch chemistry that is highly selective for the silicon nitride or other sacrificial material relative to the insulating material, and relative to the material of the thin-film channel layer 401. As a result of the removal of the sacrificial material, voids 811-818 are formed between the layers of insulating material 210, without removing the thin-film channel layer 401.

Figure 9:
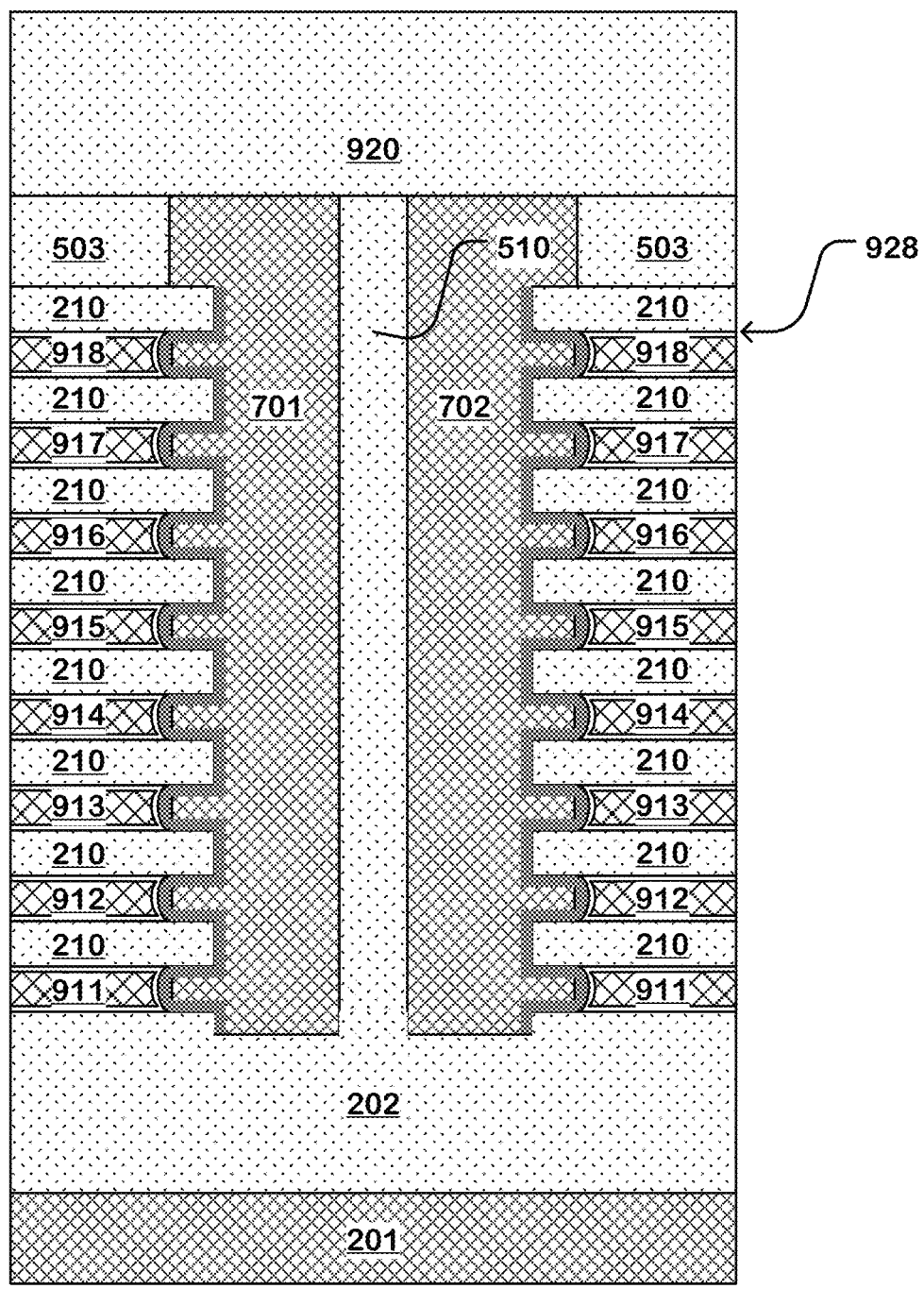

FIG. 9 illustrates a subassembly after lining the voids 811-818 with a data storage structure, which comprises a multilayer dielectric charge trapping structure in some embodiments. So, for example, the data storage structure 928 can be formed by forming a tunneling layer in contact with the thin-film channel layer 401, a charge trapping layer on the tunneling layer, and a blocking layer facing the remaining parts of the voids into which the structure is formed. After forming data storage structure 928, the voids can be filled by a word line material such as tungsten or other suitable conductor forming word lines 911-918 contacting the blocking layer of the data storage structure in a dielectric charge trapping embodiment. Also, the layer 920 of insulating material, such as an interlayer dielectric can be formed on top of the structure.

Thereafter, metallization procedures and other back-end-of-line processes are executed to form a completed vertical memory structure, such as that shown in FIGS. 1A and 1B.

Figure 10:
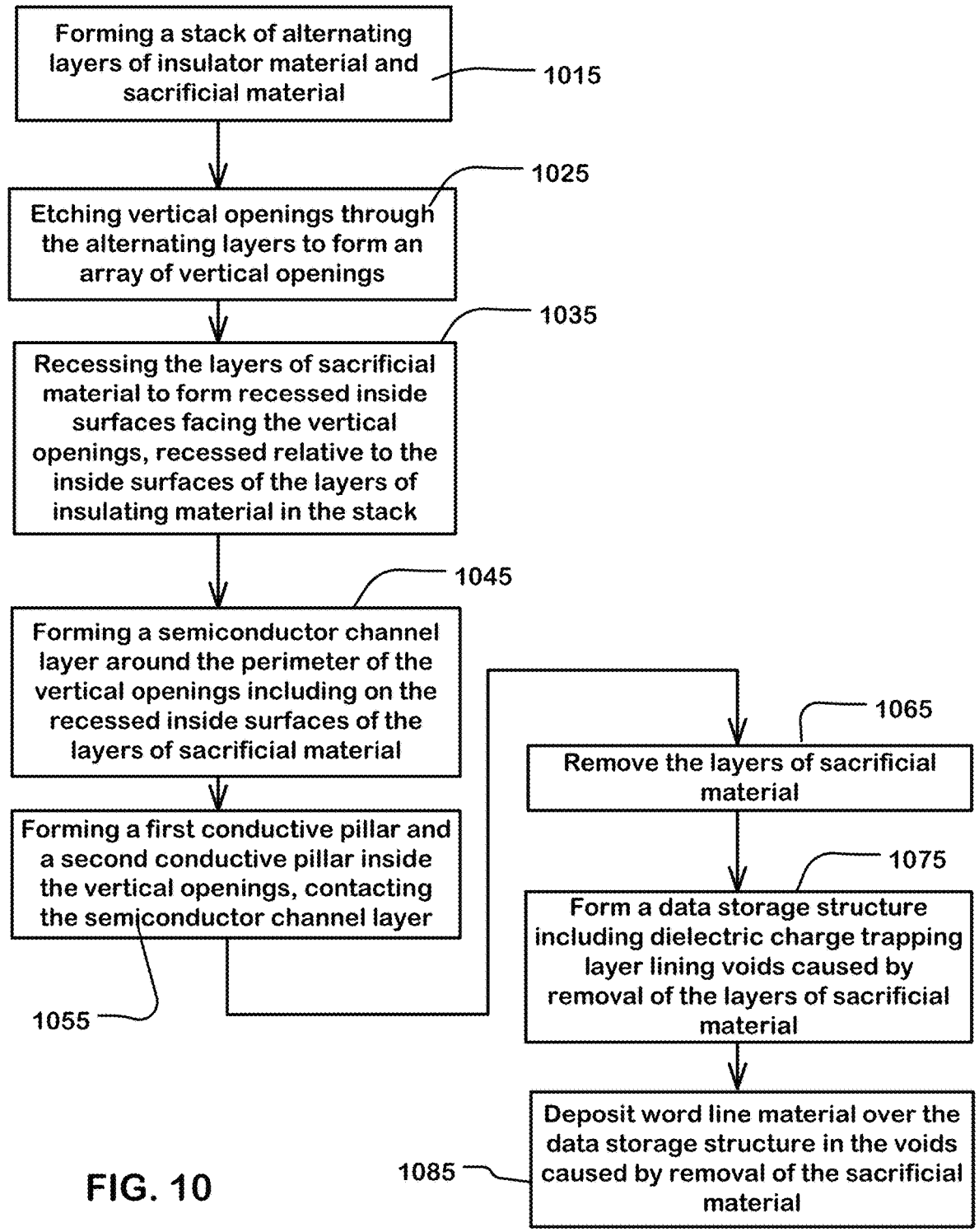
FIG. 10 is a flowchart for a manufacturing process like that illustrated with respect to FIGS. 2-9 for a concave channel, vertical memory structure.

FIG. 10 is a simplified flowchart illustrating an example of a manufacturing procedure for recessing one of the layers of insulating material and the layers of word line material to form recessed inside surfaces facing the opening recessed relative to inside surfaces facing the opening of adjacent ones of the alternating layers in the stack. FIG. 10 illustrates a process including first forming a stack of alternating layers of the insulating material and a sacrificial material, and replacing at least portions of the layers of sacrificial material with the word line material.

In FIG. 10, the word line material has recessed inside surfaces to form a concave channel NOR cell. The process of FIG. 10 is thus a method for manufacturing a concave channel, vertical memory structure like that of FIGS. 1A and 1B. The process, following the stages described with reference to FIGS. 2-9, includes forming a stack of alternating layers of insulating material and sacrificial material (1015). Next, the process includes etching vertical openings through the alternating layers to form an array of vertical openings (1025). Next, layers of sacrificial material are recessed along the sides of the vertical openings to form recessed inside surfaces facing the vertical openings. These recessed inside surfaces are recessed relative to the inside surfaces of the layers of insulating material in the stack (1035). As a result of the recessing process, the sides of the vertical opening are grooved or crenellated by the recesses which extend around the perimeter of the opening. Next, the process includes forming a semiconductor channel layer around the perimeter of the vertical openings, including on the recessed inside surfaces of the layers of sacrificial material (1045). The process includes forming a first vertical conductive pillar and a second vertical conductive pillar inside the vertical openings, and disposed on first and second sides of the vertical openings. The first and second conductive pillars contact the semiconductor channel layer (1055). The process includes removing the layers of sacrificial material between the layers of insulating material without removing the semiconductor channel layer that had been formed on the recessed inside surfaces of the layers of sacrificial material (1065). Then, data storage structures are formed within the voids left by removal of the layers of sacrificial material. This can include forming a dielectric charge trapping layer that lines the voids (1075). The procedure then includes depositing word line material over the data storage structures within the voids (1085).

Additional procedures for metallization and other back-end-of-line processes can be performed to complete the semiconductor chip.

Figure 11B:
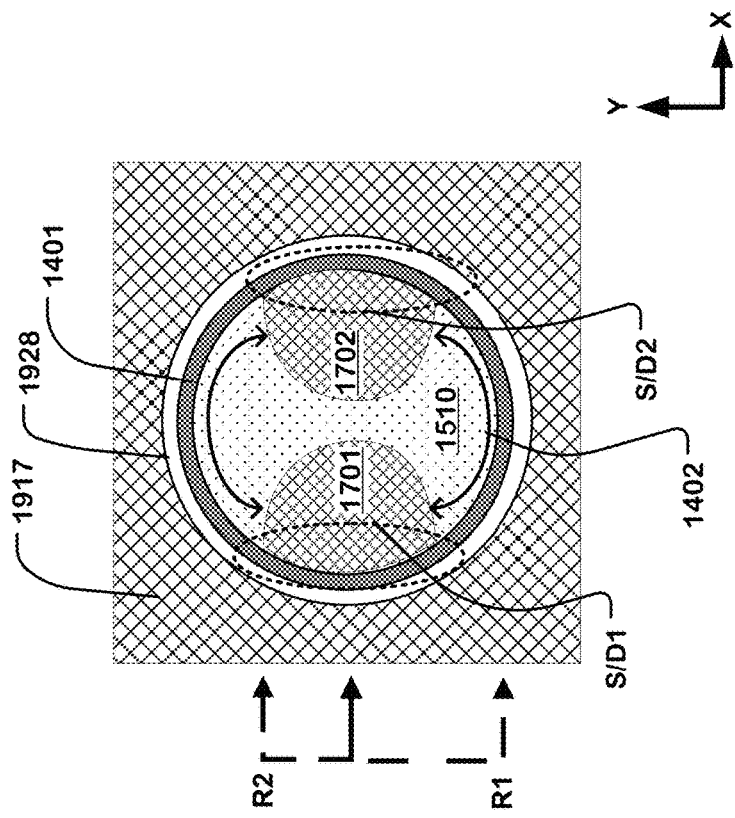
FIG. 11B is a cross-section at line A-A of FIG. 11A, in an X-Y plane of the convex channel, vertical memory structure.
Figure 11A:
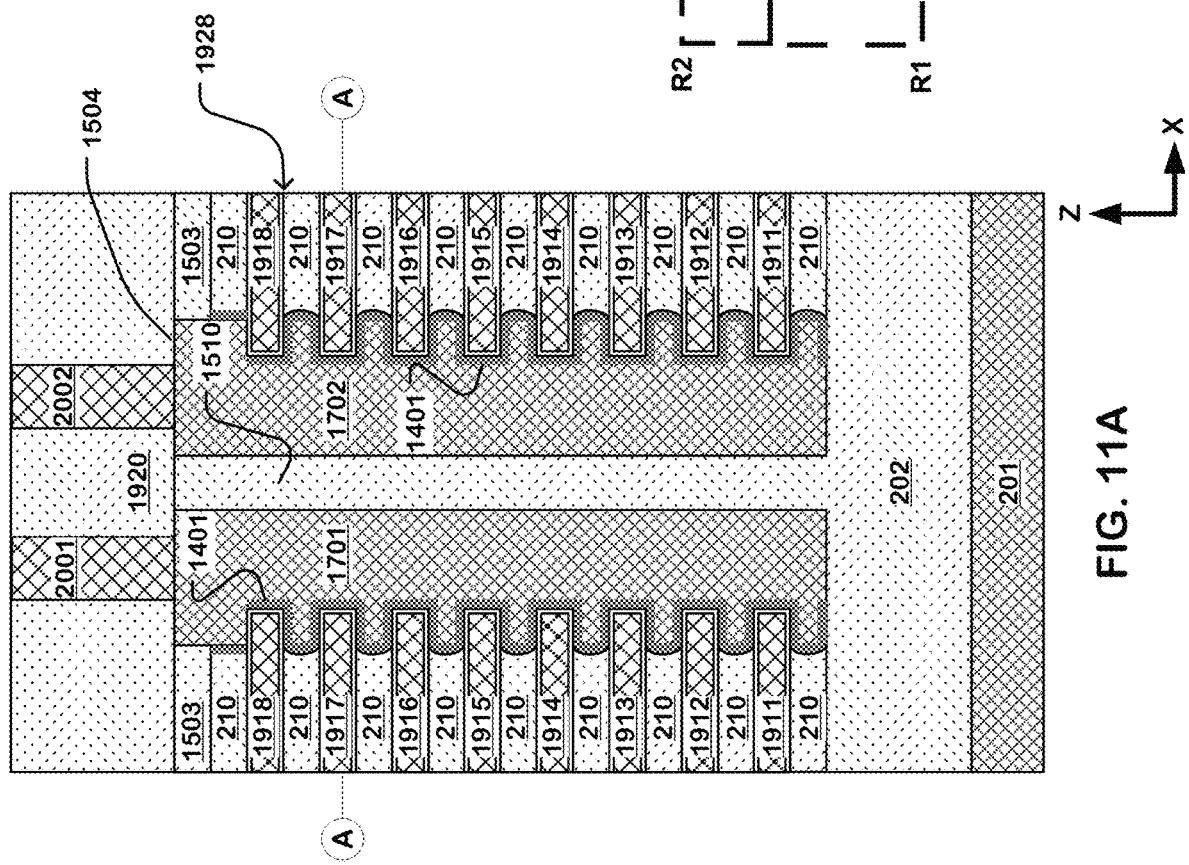
FIG. 11A is a cross-section in an X-Z plane of a convex channel, vertical memory structure as described herein.

FIG. 11A illustrates a vertical memory structure that comprises a plurality of memory cells. The vertical memory structure comprises a stack of alternating layers of insulating material 210, and layers of word line material, such as tungsten or other conductive material, where the individual layers of word line material constitute word lines 1911-1918 in this example.

The stack is formed on a substrate including, in this example, a layer of insulating material 202 on a semiconductor chip 201.

The stack of alternating layers includes a vertical opening passing through the stack, having structures disposed therein as discussed below. Inside surfaces of the layers of insulating material 210 and of the layers of word line material correspond with the outside surfaces of the vertical opening. As mentioned above, one of the layers of insulating material 210 and word line material has recessed inside surfaces.

The layers of insulating material 210 in this embodiment have recessed inside surfaces, recessed relative to inside surfaces facing the opening of the adjacent ones of the alternating layers of word line material in the stack. Thus, the layer of insulating material 210 adjacent to word lines (e.g. 1917 and 1918) immediately above and below has a recessed inside surface relative to the inside surfaces of the layers of word line material. This recess can be continuous around the perimeter of the vertical opening, forming a horizontal trench.

The vertical memory structure includes a first conductive pillar 1701 inside and on a first side of the vertical opening. Also, the vertical memory structure includes a second conductive pillar 1702 inside and on a second side of the vertical opening, and separated from the first conductive pillar 1701 by insulating fill material 1510 in this cross-section. The vertical conductive pillars 1701 and 1702 can extend above the stack through insulating material layer 1503, forming a planarized surface 1504 in this example.

A data storage structure (e.g. 1928) is disposed on the inside surface of each of the layers of word line material, including on the recessed inside surfaces. The data storage structure (e.g. 1928) can comprise a dielectric charge trapping film, such as implemented using so-called SONOS, BE-SONOS and related technologies, that includes a multilayer dielectric having a tunneling layer such as a silicon oxide, or a silicon oxide/silicon nitride combination (e.g. (Oxide/Nitride/Oxide), a charge trapping layer such as silicon nitride or other materials, and a blocking layer such as a silicon oxide, aluminum oxide and combinations of such materials.

In the illustrated example, the data storage structures (e.g. 1928) line the upper and lower sides of the layers of word line material, and the inside surface of the layer of word line material.

A semiconductor thin-film channel layer 1401 is disposed on the data storage structures around the perimeter of the vertical opening between the data storage structures and the first and second vertical conductive pillars 1701, 1702, at least at the levels of the word lines. The semiconductor thin-film channel layer 1401 has first and second source/drain terminals at contacts with the first and second conductive pillars on the first and second sides of the vertical opening.

The first and second conductive pillars 1701, 1702 in the vertical opening, fill the regions formed by the recessed inside surfaces of the layers of insulating material 210 and the thin-film channel layer 1401, between the layers of word line material. Thin-film channel layer 1401 therefore forms a convex channel region at each of the word lines 1911-1918 which extends around the perimeter of the vertical opening. At each layer, such as the layer at word line 1917, a memory cell is formed. This convex channel region wrapping over the inside surfaces of layers of word line material can be continuous around the perimeter of the vertical opening, forming a horizontal channel.

A layer of insulating material 1920 is disposed over the stack. Contact plugs 2001 and 2002 can be formed through the insulating material 1920 for connection to the vertical conductive pillars 1701 and 1702 at the planarized surface 1504.

A plurality of bit line select transistors (not shown) can be disposed over and connected to respective contact plugs 2001, 2002. A plurality of bit lines (not shown) can be disposed over and connected to bit line select transistors in the plurality of bit line select transistors, the bit lines extending in a second direction (Y-direction) orthogonal to the first direction (X-direction). A plurality of gate lines can be disposed at a level of the bit line select transistors and connected to respective columns of bit line select transistors in the plurality of bit line select transistors, the gate lines extending in the first direction. The bit line select transistors can comprise channel films connected at lower ends to respective vertical conductive structures. The bit lines can be connected to the respective rows of bit line select transistors via contacts to respective upper ends of the channel films.

FIG. 11B is a cross-section taken on the line A-A of FIG. 11A through the word line 1917 at which a memory cell is formed.

The vertical opening as illustrated is circular in this example. In other embodiments, the vertical opening can be elliptical or have other shapes.

Inside the vertical opening, a first conductive pillar 1701 and a second conductive pillar 1702 are disposed, through insulating fill material 1510.

As seen in FIG. 11B, the layer of word line material constituting word line 1917 has a data storage structure 1928 disposed on its inside surface. A thin-film channel layer 1401, such as polysilicon, is disposed on the data storage structure 1928, extending around the perimeter of the vertical opening. The thin-film channel layer 1401 has a contact S/D1 with the first conductive pillar 1701 on a first side of the vertical opening, and a contact S/D2 with the second conductive pillar 1702 on a second side of vertical opening. Source/drain terminals are formed at the contacts S/D1 and S/D2.

The memory cell formed at this layer has channel regions which extend around the perimeter of the vertical opening as indicated at the arrows (e.g. 1402) indicating the current flow direction between the source/drain terminals at the contacts S/D1 and S/D2.

The memory cell can be a dielectric charge trapping memory cell, in which charge is trapped in the data storage structure 928 over the channel region between the source and drain terminals. The gate of the memory cell is formed by the word line 1917. The memory cell has a curved outer channel layer, wrapping around the layers of word line material as exposed by the pulled back adjacent layers of insulating material. This structure can result in a better coupling ratio with higher fringing fields to support charge tunneling fields for program or erase of a given cell in the stack. In addition, the convex configuration provides a larger channel width in the vertical direction, which can support higher current at a given operating condition relative to more narrow channel widths.

The vertical opening has an outside perimeter with an opening average radius R1 as illustrated in this example (not including the thickness of the data storage structure 1928 and the thin film channel layer 1401), at the inside surface of the layer of word line material constituting the word line 1917. The first and second conductive pillars have average radii R2, which can be, but are not necessarily, the same. In advantageous embodiments, the average radii R2 are more than one quarter of the opening average radius R1, and less than one half of the opening average radius R2. As a result, the vertical conductive pillars 1701 and 1702 can be electrically isolated, and relatively conductive as a result of substantial cross-sectional area, and having a substantial area of electrical contact with the thin-film channel layer 1401.

The vertical memory structure of FIGS. 11A and 11B with the concave channel, can be arranged as illustrated in FIGS. 1C and 1D to form a large scale, dense NOR memory array.

FIGS. 12-19 illustrate stages in a manufacturing process for a concave channel vertical memory structure like that of FIGS. 11A and 11B.

Figure 12:
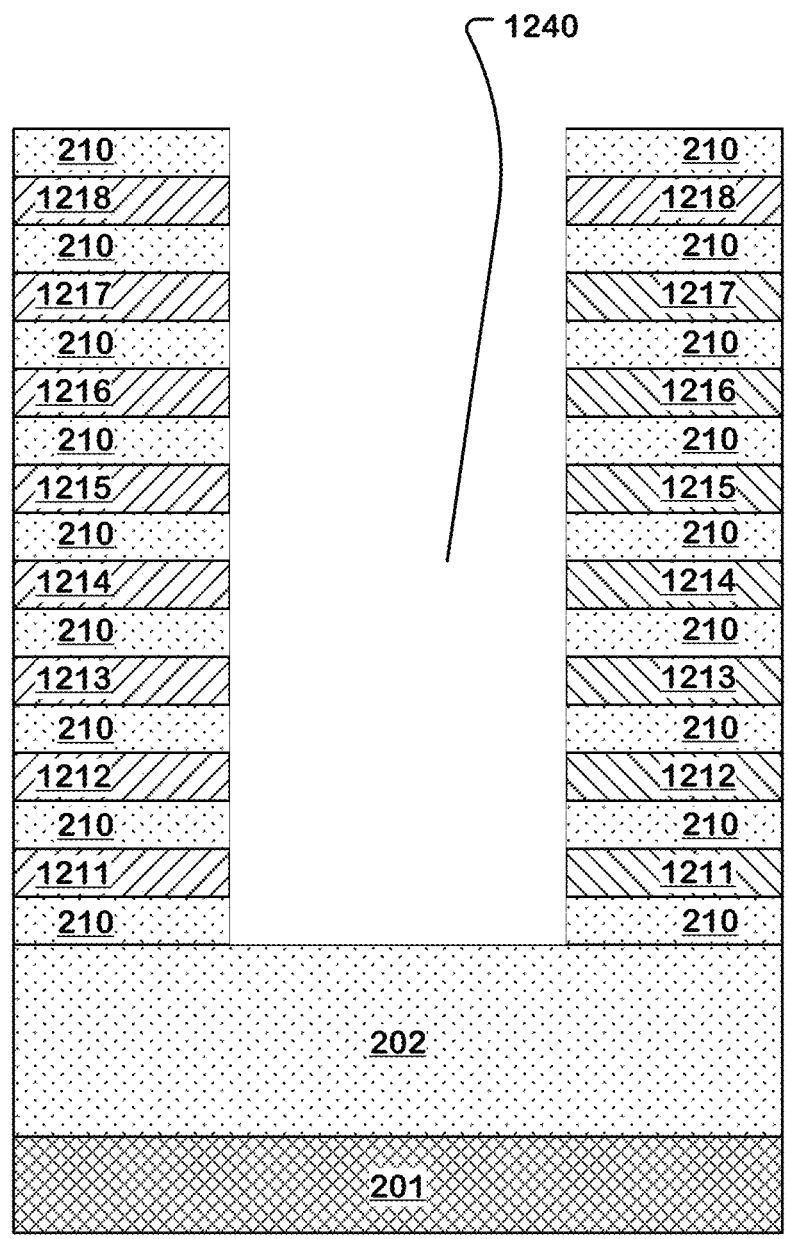
FIGS. 12-19 illustrate stages in a manufacturing process usable to manufacture the convex channel, vertical memory structure of FIGS. 11A-11B.

FIG. 12 illustrates a subassembly after providing a substrate that includes a semiconductor chip 201 and an insulating layer 202, forming a stack on the substrate of alternating layers of an insulating material 210 such as silicon oxide, and a sacrificial material which is silicon nitride, where the sacrificial material is disposed in the stack at the locations 1211-1218 of word lines, and etching a vertical opening 1240 through the stack extending below the location 211 of the lowest layer of sacrificial material, and to the surface of insulating layer 202, in this example.

Figure 13:
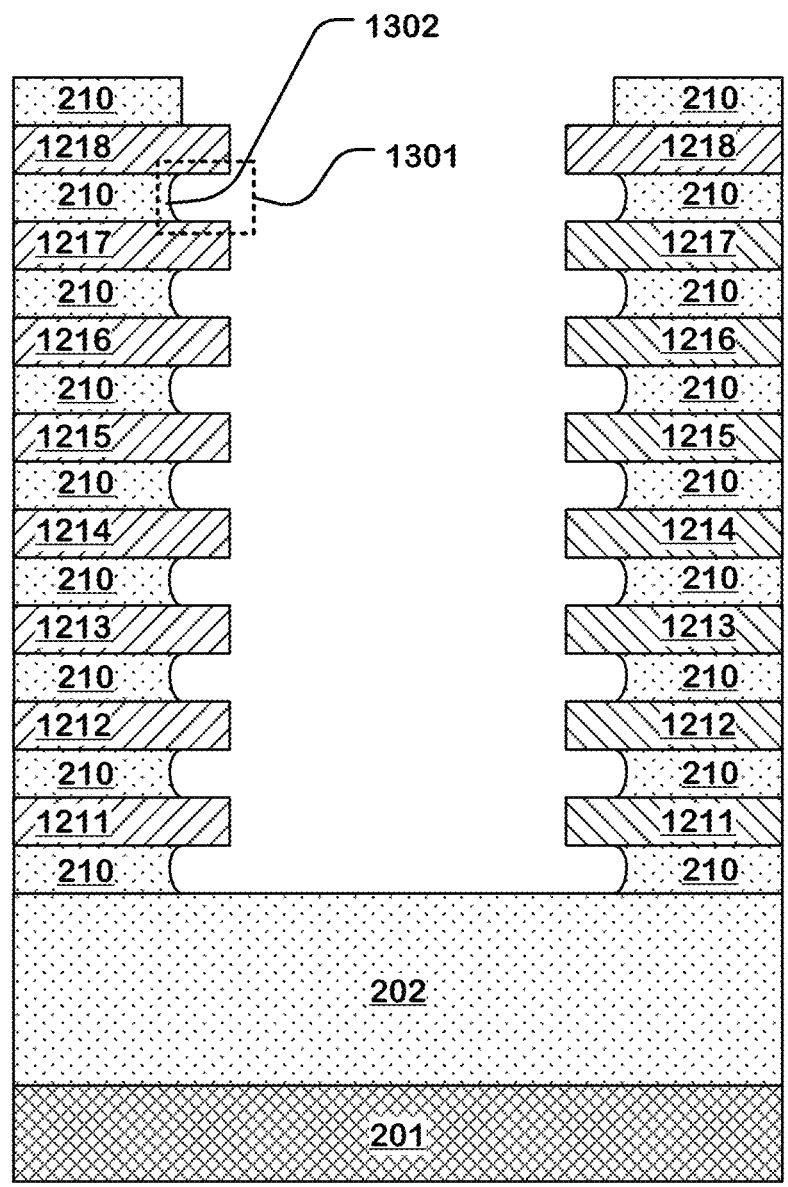

FIG. 13 illustrates a subassembly after utilizing a dry etching, a SICONI etch or wet etch (deionized HF) technique having high selectivity for the insulating material 210 relative to the sacrificial material to pull back the inside surfaces of the insulating material. As result of the pullback etching, layers of insulating material have inside surfaces (e.g. 1302) facing the outside surfaces of the vertical opening that are curved between the adjacent layers of sacrificial material. This forms recesses (e.g. 1301) defined by the outside edges of the layers of sacrificial material at the locations 1211-1218, and the recessed inside surfaces (e.g. 1302) of the layers of insulating material.

Figure 14:
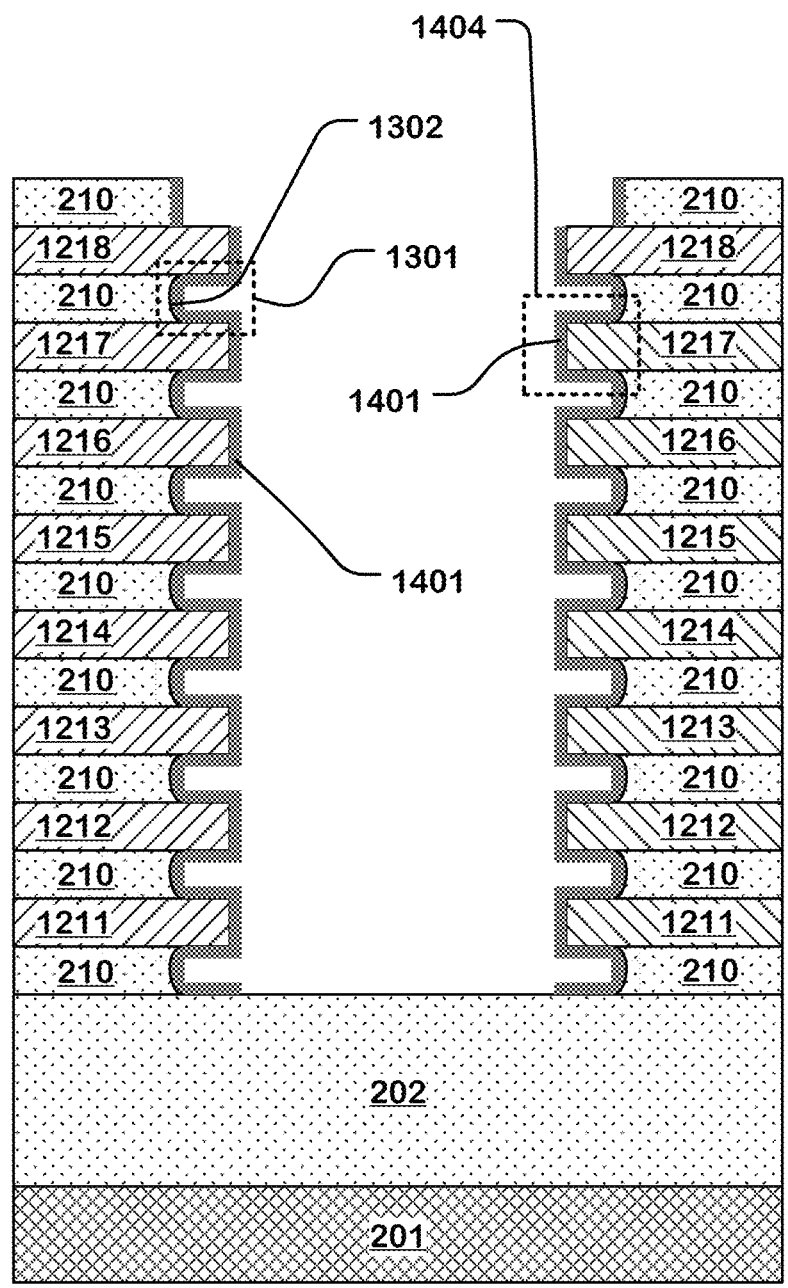

FIG. 14 illustrates a subassembly after depositing a thin-film channel layer 1401 of channel material over the structure, and then anisotropic etching to remove the material from the bottom and top of the vertical opening. The thin-film channel layer 1401 lines the inside surfaces of the vertical opening around the full perimeter of the opening. The thin-film channel layer 1401 is disposed on the recessed inside surfaces of the layers of insulating material, and on the protruding inside surfaces of the layers of sacrificial material. As seen in the box 1404, the thin-film channel layer 1401 covers and curves around (on radii in a plane parallel to the vertical direction of the vertical opening) the exposed inside surfaces and undersides of the layers of sacrificial material, and the exposed inside surfaces of the adjacent layers of insulating material 210. Also, in this embodiment, thin-film channel layer 1401 is continuous from the top layer of sacrificial material to the bottom layer of sacrificial material of the vertical opening. In other embodiments, the thin-film channel layer 1401 might be discontinuous at the exposed inside surfaces of the layers of insulating material 210.

Figure 15:
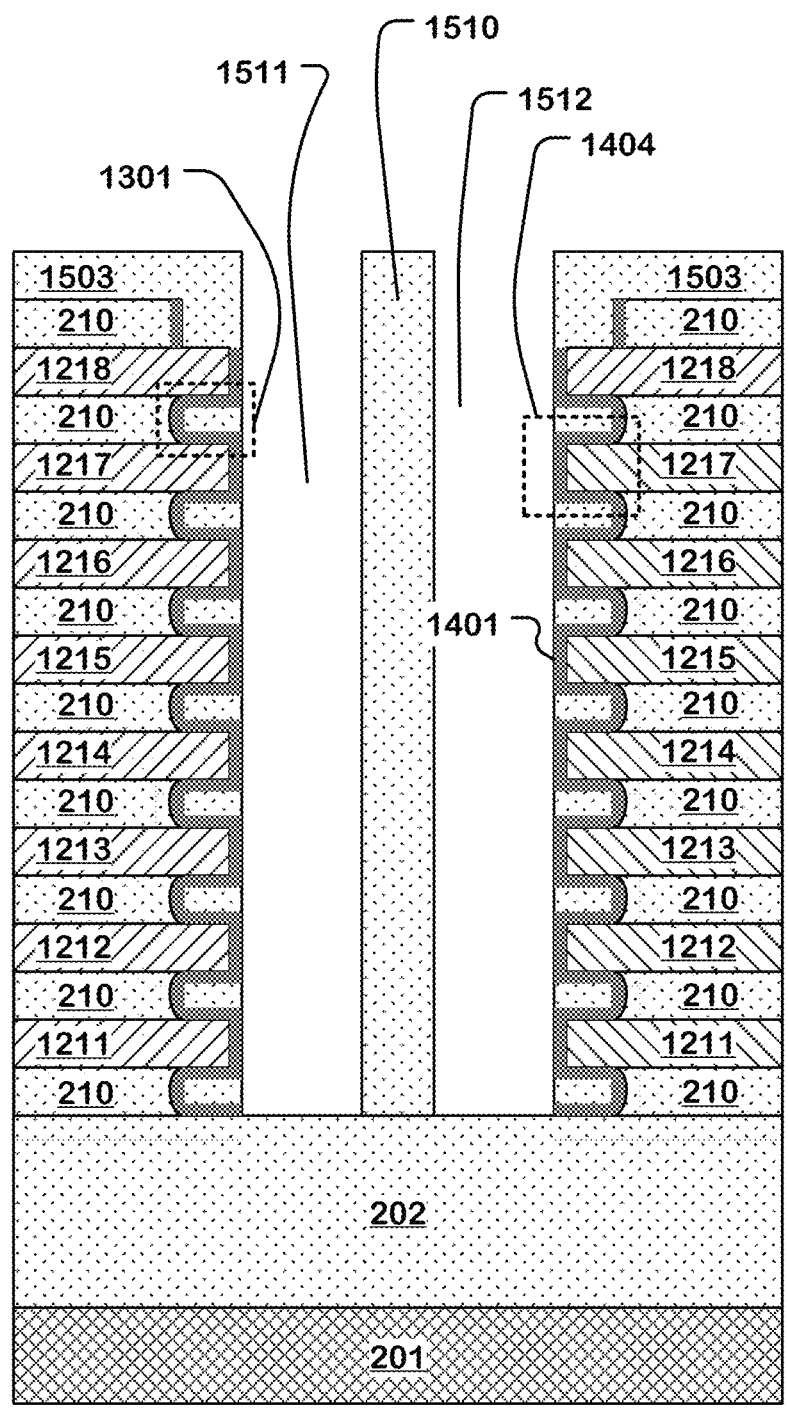

FIG. 15 illustrates a subassembly after filling the vertical opening with an insulating material 1510, including insulating material layer 1503 over the stack, planarizing the structure such as by using chemical mechanical polishing, and then forming openings 1511, 1512 therethrough in which vertical conductors can be formed. At this stage, the recesses (e.g. 1301) may also be filled with insulating material 1510. The openings 1511 and 1512 for the vertical conductors extend below the lowest layer of sacrificial material to be used as a word line 1211, in this embodiment, and to the underlying insulating layer 202.

Figure 16:
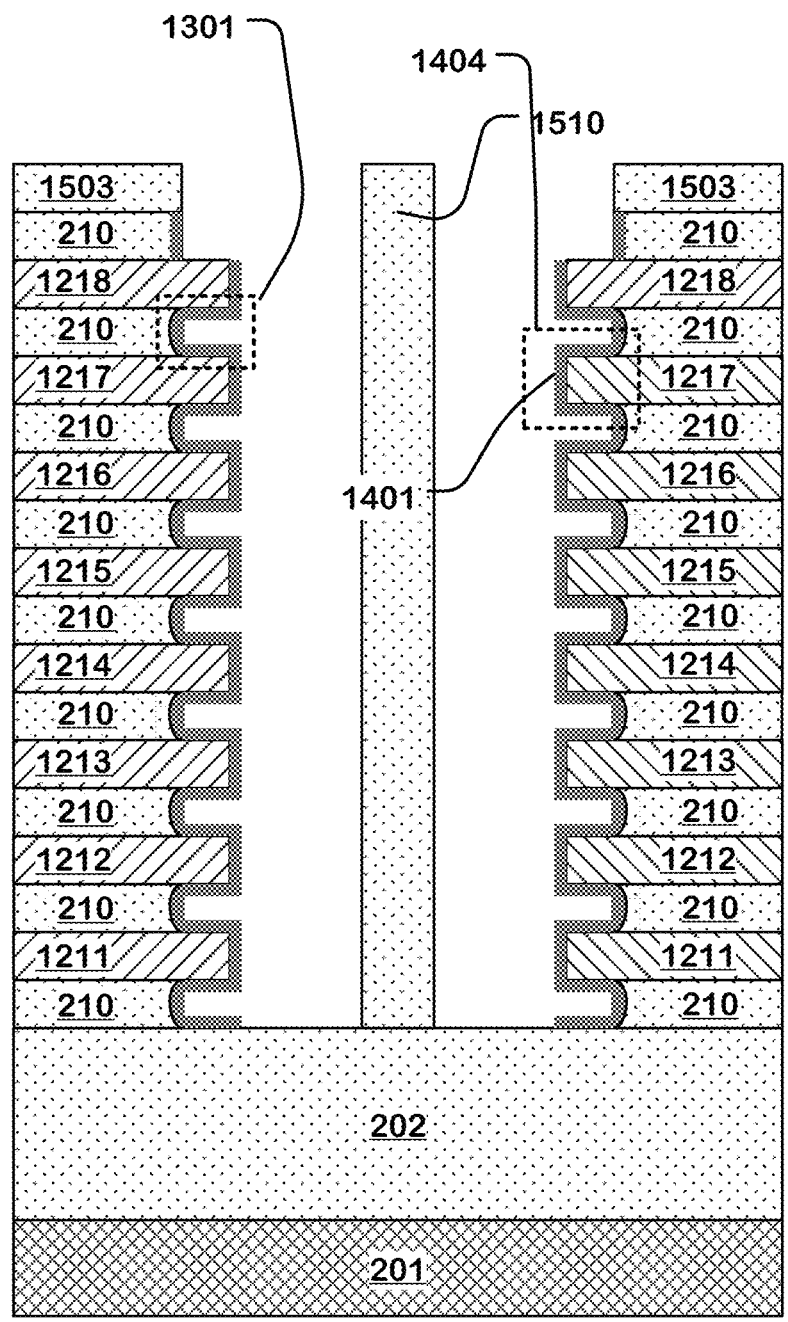

FIG. 16 illustrates a subassembly after a pullback etch to remove the insulating material 1510 from within the recesses. Thus, the recess 1301 after the pullback of the insulating material 1510 remains lined by the thin-film channel layer 1401, but is otherwise empty. The pullback may or may not completely remove the insulating material from within the recess 1301.

Figure 17:
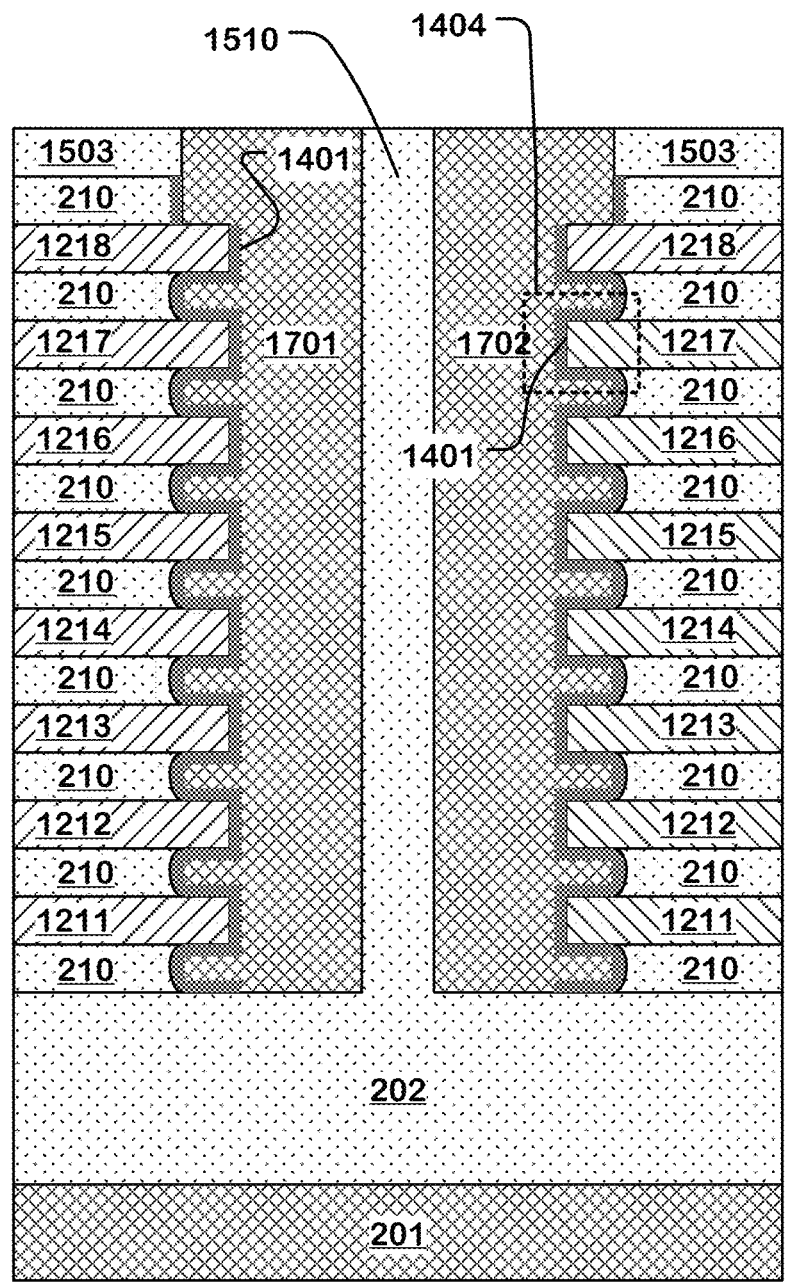

FIG. 17 illustrates a subassembly after performing a vertical conductor fill in, such as a polysilicon plug fill, into the openings 1511 and 1512, including filling the recesses (e.g. 1301). An etch back or planarizing step, such as chemical mechanical polishing, is then applied to form a planar surface. The polysilicon plug fill in the openings 1511 and 1512 makes electrical contact with the thin-film channel layer 1401.

Figure 18:
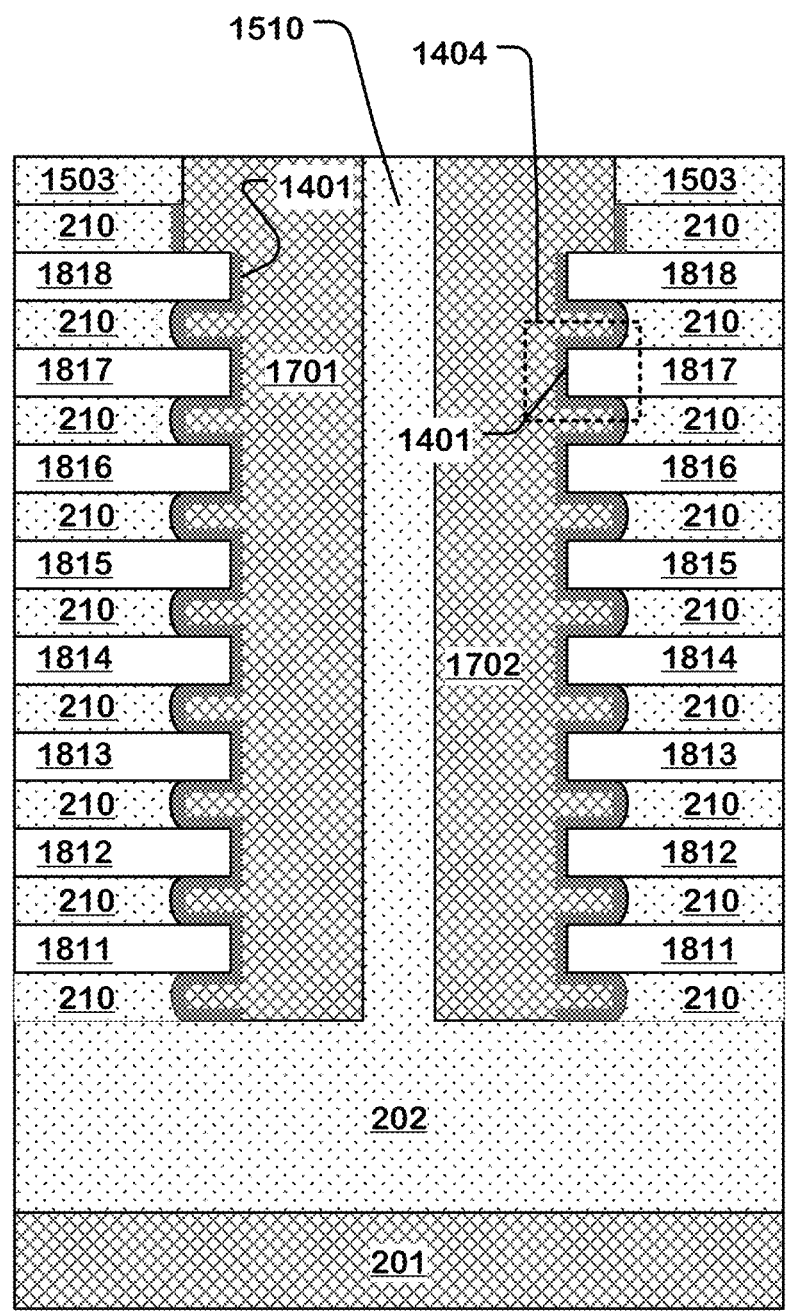

FIG. 18 illustrates a subassembly after removing the layers of sacrificial material 1211-1218. This can be done through a lateral opening, not shown, applying an etch chemistry that is highly selective for the silicon nitride or other sacrificial material relative to the insulating material, and relative to the material of the thin-film channel layer 1401. As a result of the removal of the sacrificial material, voids 1811-1818 are formed between the layers of insulating material 210, without removing the thin-film channel layer 1401.

Figure 19:
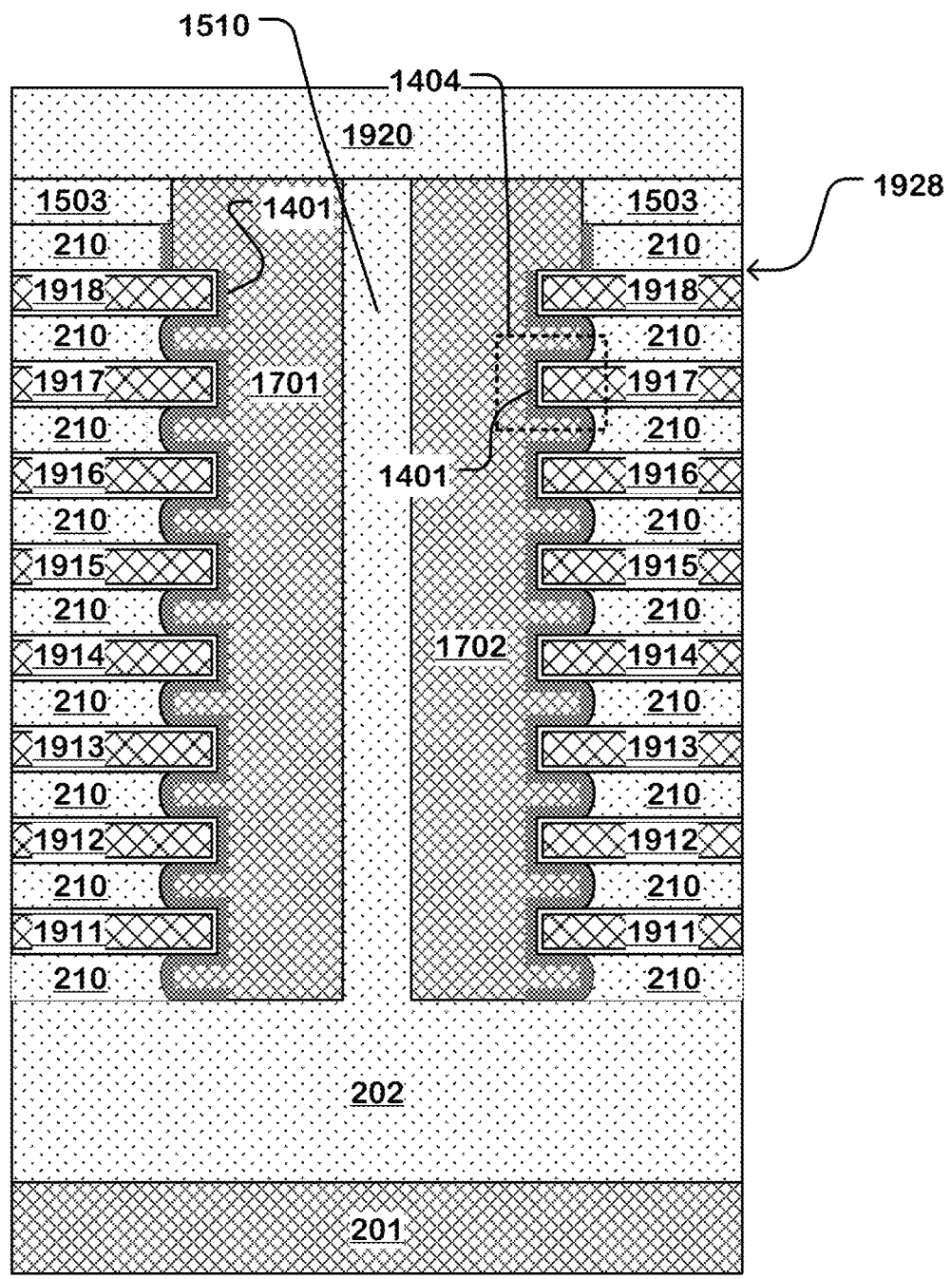

FIG. 19 illustrates a subassembly after lining the voids 1811-1818 with a data storage structure, which comprises a multilayer dielectric charge trapping structure in some embodiments. So, for example, the data storage structure 1928 can be formed by forming a tunneling layer in contact with the thin-film channel layer 1401, a charge trapping layer on the tunneling layer, and a blocking layer facing the remaining parts of the voids into which the structure is formed. After forming data storage structure 1928, the voids can be filled by a word line material such as tungsten or other suitable conductor forming word lines 1911-1918 contacting the blocking layer of the data storage structure in a dielectric charge trapping embodiment. Memory cells are formed as a result as seen in box 1404, with curved channel structures. Also, the layer 1920 of insulating material, such as an interlayer dielectric, can be formed on top of the structure.

Thereafter, metallization procedures and other back-end-of-line processes are executed to form a completed vertical memory structure, such as that shown in FIGS. 11A and 11B.

Figure 20:
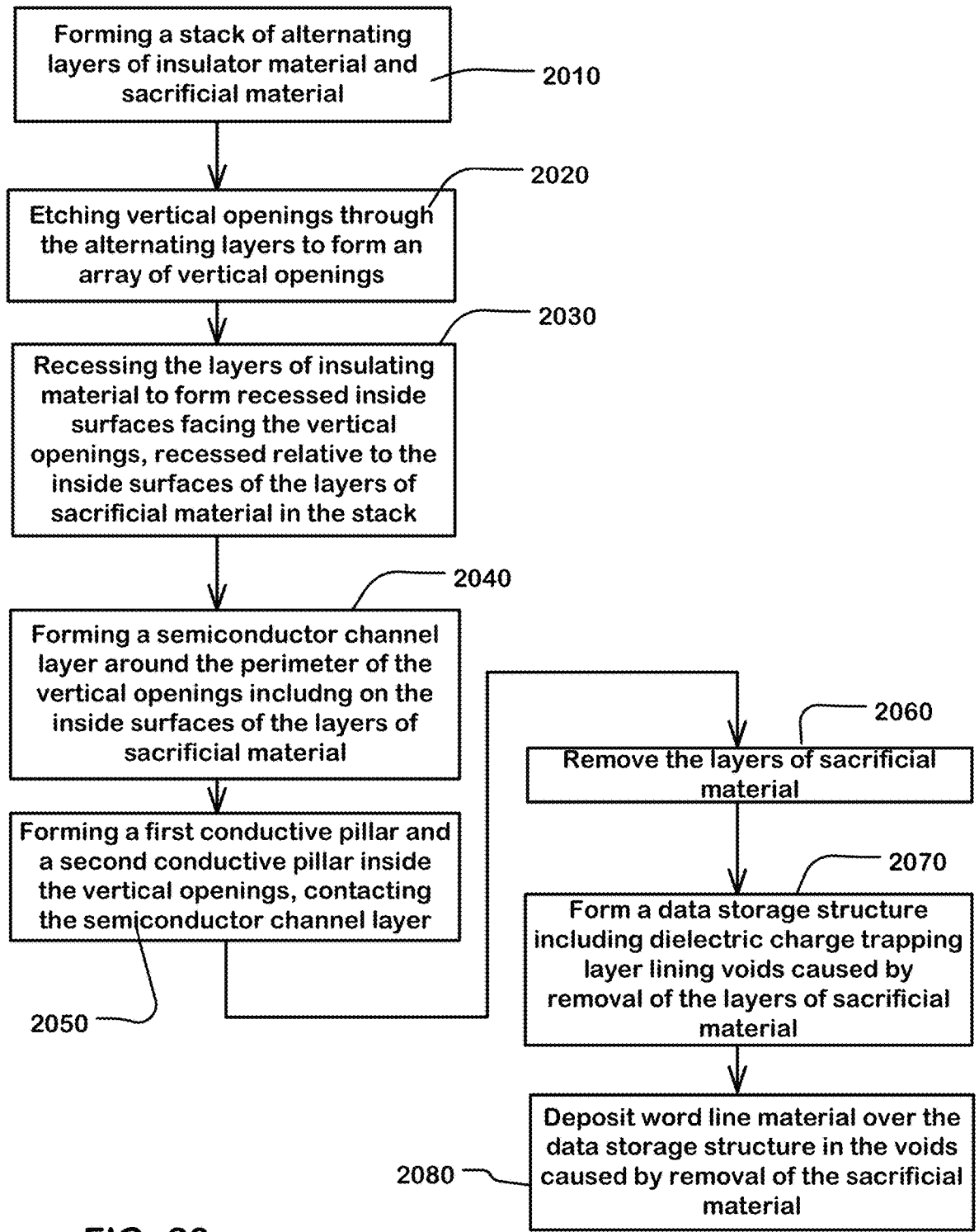
FIG. 20 is a flowchart for a manufacturing process like that illustrated with respect to FIGS. 12-19 for a convex channel, vertical memory structure

FIG. 20 is a simplified flowchart illustrating an example of a manufacturing procedure for recessing one of the layers of insulating material and the layers of word line material to form recessed inside surfaces facing the opening recessed relative to inside surfaces facing the opening of adjacent ones of the alternating layers in the stack. FIG. 20 illustrates a process including first forming a stack of alternating layers of the insulating material and a sacrificial material, and replacing at least portions of the layers of sacrificial material with the word line material.

In FIG. 20, the layers of insulating material have recessed inside surfaces to form convex channel NOR cells. The process of FIG. 20 is thus a method for manufacturing a concave channel, vertical memory structure like that of FIGS. 11A and 11B. The process, following the stages described with reference to FIGS. 12-19, includes forming a stack of alternating layers of insulating material and sacrificial material (2010). Next, the process includes etching vertical openings through the alternating layers to form an array of vertical openings (2020). Next, layers of insulating material are recessed along the sides of the vertical openings to form recessed inside surfaces facing the vertical openings. These recessed inside surfaces are recessed relative to the inside surfaces of the layers of sacrificial material in the stack (2030). As a result of the recessing process, the sides of the vertical opening are grooved or crenellated by the recesses which extend around the perimeter of the opening. Next, the process includes forming a semiconductor channel layer around the perimeter of the vertical openings, including on the recessed inside surfaces of the layers of sacrificial material (2040). The process includes forming a first vertical conductive pillar and a second vertical conductive pillar inside the vertical openings, and disposed on first and second sides of the vertical openings. The first and second conductive pillars contact the semiconductor channel layer (2050). The process includes removing the layers of sacrificial material between the layers of insulating material without removing the semiconductor channel layer that had been formed on the exposed inside surfaces of the layers of sacrificial material (2060). Then, data storage structures are formed within the voids left by removal of the layers of sacrificial material. This can include forming a dielectric charge trapping layer that lines the voids (2070). The procedure then includes depositing word line material over the data storage structures within the voids (2080).

Additional procedures for metallization and other back-end-of-line processes can be performed to complete the semiconductor chip.

Figure 21:
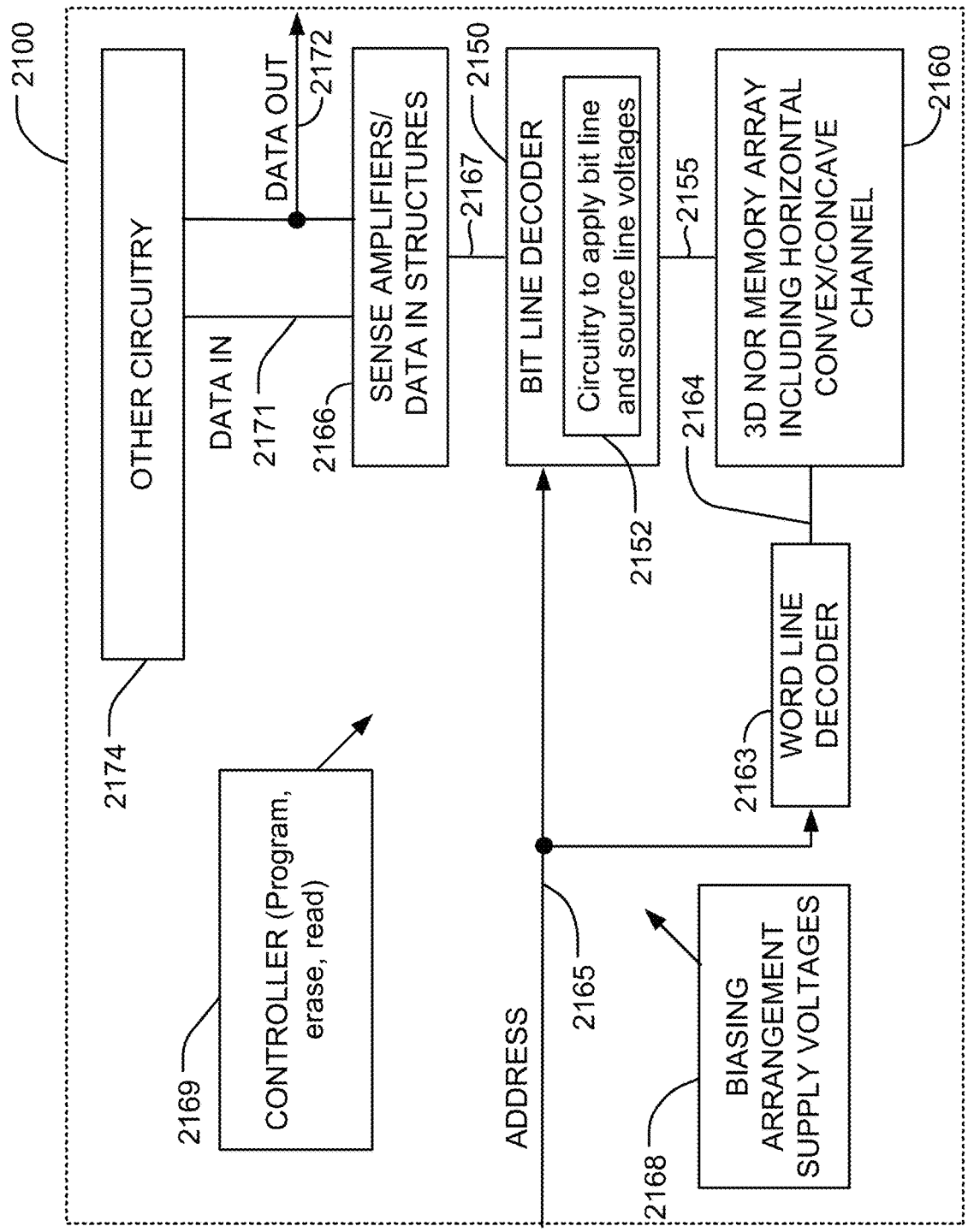
FIG. 21 is a simplified block diagram of an integrated circuit memory device comprising vertical memory structures as described herein.

FIG. 21 a simplified block diagram of an integrated circuit memory device in accordance with the present technology. In the example shown in FIG. 21, the integrated circuit memory device 2100 includes a 3D NOR memory array 2160 having an array of memory cells with convex channel, or concave channel, structures.

The memory device can include circuitry 2152 connected to the bit lines 2155 to apply bit line and source line voltages.

A bit line decoder 2150 can include circuitry 2152 connected to the bit lines 2155. A word line decoder 2163 is coupled to a plurality of word lines 2164 for reading, erasing and programming data from the memory cells in the memory array 2160. Addresses are supplied on bus 2165 to word line decoder 2163 and bit line decoder 2150. Sense amplifiers and data-in structures in block 2166 are coupled to the bit line decoder 2150 in this example via data bus 2167. Data is supplied via the data-in line 2171 from input/output ports on the integrated circuit 2100 or from other data sources internal or external to the integrated circuit 2100, to the data-in structures in block 2166. In the illustrated embodiment, other circuitry 2174 is included on the integrated circuit, such as a general purpose processor or special purpose application circuitry, or a combination of modules providing system-on-a-chip functionality supported by the programmable resistance cell array. Data is supplied via the data-out line 2172 from the sense amplifiers in block 2166 to input/output ports on the integrated circuit 2100, or to other data destinations internal or external to the integrated circuit 2100.

A controller 2169 implemented, in this example using bias arrangement state machine, controls the application of bias arrangement supply voltages generated or provided through the voltage supply or supplies in block 2168, such as program, erase and read voltages.

The controller can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

A number of flowcharts illustrating manufacturing processes are described herein. It will be appreciated that many of the steps can be combined, performed in parallel or performed in a different sequence without affecting the structures or functions achieved. In some cases, as the reader will appreciate, a rearrangement of steps will achieve the same results only if certain other changes are made as well. In other cases, as the reader will appreciate, a rearrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A vertical memory structure, comprising:
    a stack of alternating layers of insulator material and word line material with a vertical opening through the alternating layers, one of the layers of insulator material and layers of word line material having recessed inside surfaces facing the vertical opening, recessed relative to inside surfaces facing the vertical opening of adjacent ones of the alternating layers in the stack;
    a first conductive pillar inside and on a first side of the vertical opening;
    a second conductive pillar inside and on a second side of the vertical opening, and separated from the first conductive pillar, such that no portion of the first conductive pillar is in contact with any portion of the second conductive pillar;
    a data storage structure disposed on inside surfaces of the layers of word line material; and
    a semiconductor channel layer disposed on the data storage structures around a perimeter of the vertical opening, and having first and second source/drain terminals at contacts with the first and second conductive pillars on the first and second sides of the vertical opening.

2. The vertical memory structure of claim 1, wherein the recessed inside surfaces are inside surfaces of the layers of insulator material.

3. The vertical memory structure of claim 2, wherein the semiconductor channel layer is convex over inside surfaces of the layers of word line material.

4. The vertical memory structure of claim 2, wherein the perimeter of the vertical opening has an opening average radius at the inside surface of a given layer of the layers of word line material in the stack, and the first and second conductive pillars have average radii that are less than one half the opening average radius at said given layer.

5. The vertical memory structure of claim 2, wherein the perimeter of the vertical opening has an opening average radius at the inside surface of a given layer of the layers of word line material in the stack, and the first and second conductive pillars have average radii that are more than one quarter the opening average radius at said given layer.

6. The vertical memory structure of claim 1, wherein the layers of word line material, the semiconductor channel layer, the data storage structure and the first and second source/drain terminals form a plurality of memory cells connected in parallel between the first and second conductive pillars.

7. The vertical memory structure of claim 1, wherein the recessed inside surfaces are inside surfaces of the layers of word line material.

8. The vertical memory structure of claim 7, wherein the semiconductor channel layer is concave at inside surfaces of the layers of word line material.

9. The vertical memory structure of claim 7, wherein the vertical opening has an outside perimeter with an opening average radius at the inside surface of a given layer of the layers of word line material in the stack, and the first and second conductive pillars have average radii that are less than one half the opening average radius at said given layer.

10. The vertical memory structure of claim 7, wherein the vertical opening has an outside perimeter with an opening average radius at the inside surface of a given layer of the layers of word line material in the stack, and the first and second conductive pillars have average radii that are more than one quarter the opening average radius at said given layer.

11. A method of manufacturing a vertical memory structure, comprising:
    forming a stack of alternating layers of insulator material and word line material with a vertical opening through the alternating layers;
    recessing one of the layers of insulator material and the layers of word line material to form recessed inside surfaces facing the vertical opening recessed relative to inside surfaces facing the vertical opening of adjacent ones of the alternating layers in the stack;
    forming a data storage structure on inside surfaces of the layers of word line material;
    forming a semiconductor channel layer on the data storage structure around a perimeter of the vertical opening;
    forming a first conductive pillar inside and on a first side of the vertical opening; and forming a second conductive pillar inside and on a second side of the vertical opening, and separated from the first conductive pillar, such that no portion of the first conductive pillar is in contact with any portion of the second conductive pillar, the first conductive pillar and the second conductive pillar contacting the semiconductor channel layer to form first and second source/drain terminals on the first and second sides of the vertical opening.

12. The method of manufacturing a vertical memory structure of claim 11, wherein the recessed inside surfaces are inside surfaces of the layers of insulator material.

13. The method of manufacturing a vertical memory structure of claim 12, wherein the semiconductor channel layer is convex over inside surfaces of the layers of word line material.

14. The method of manufacturing a vertical memory structure of claim 12, wherein the vertical opening has an outside perimeter with an opening average radius at the inside surface of a given layer of the layers of word line material in the stack, and the first and second conductive pillars have average radii that are less than one half the opening average radius at said given layer.

15. The method of manufacturing a vertical memory structure of claim 12, wherein the vertical opening has an outside perimeter with an opening average radius at the inside surface of a given layer of the layers of word line material in the stack, and the first and second conductive pillars have average radii that are more than one quarter the opening average radius at said given layer.

16. The method of manufacturing a vertical memory structure of claim 11, wherein said forming a stack includes first forming a stack of alternating layers of the insulator material and a sacrificial material, and replacing at least portions of the layers of sacrificial material with the word line material.

17. The method of manufacturing a vertical memory structure of claim 16, wherein said recessing comprises recessing one of the layers of insulator material and the layers of sacrificial material before forming the data storage structure, and thereafter replacing the at least portions of the layers of sacrificial material with word line material.

18. The method of manufacturing a vertical memory structure of claim 11, wherein the recessed inside surfaces are inside surfaces of the layers of word line material.

19. The method of manufacturing a vertical memory structure of claim 18, wherein the semiconductor channel layer is concave at inside surfaces of the layers of word line material.

20. The method of manufacturing a vertical memory structure of claim 18, wherein the vertical opening has an outside perimeter with an opening average radius at the inside surface of a given layer of the layers of word line material in the stack, and the first and second conductive pillars have average radii that are less than one half the opening average radius at said given layer.

* * * * *